(12) United States Patent
Lyons

(10) Patent No.: US 6,391,525 B1
(45) Date of Patent: May 21, 2002

(54) SIDEWALL PATTERNING FOR SUB 100 NM GATE CONDUCTORS

(75) Inventor: Christopher F. Lyons, Fremont, CA (US)

(73) Assignee: Advanced Micro Devices, Inc., Sunnyvale, CA (US)

(*) Notice: Subject to any disclaimer, the term of this patent is extended or adjusted under 35 U.S.C. 154(b) by 0 days.

(21) Appl. No.: 09/482,256

(22) Filed: Jan. 13, 2000

Related U.S. Application Data

(63) Continuation-in-part of application No. 09/266,367, filed on Mar. 11, 1999, and a continuation-in-part of application No. 09/234,380, filed on Jan. 20, 1999, now Pat. No. 6,291,137, and a continuation-in-part of application No. 09/234,379, filed on Jan. 20, 1999, now Pat. No. 6,214,737, and a continuation-in-part of application No. 09/207,551, filed on Dec. 8, 1998, now Pat. No. 6,183,938.

(51) Int. Cl.$^7$ .................................................. G03F 7/00
(52) U.S. Cl. .................... 430/311; 430/312; 430/314; 430/316; 430/317; 430/318
(58) Field of Search .............................. 430/311, 312, 430/314, 316, 317, 318

(56) References Cited

U.S. PATENT DOCUMENTS

| | | | |
|---|---|---|---|
| 5,573,890 A | 11/1996 | Spence | 430/311 |
| 5,595,941 A | 1/1997 | Okamoto et al. | 437/228 |
| 5,705,321 A | 1/1998 | Brueck et al. | 430/316 |
| 5,710,066 A | 1/1998 | Okamoto et al. | 437/228 |
| 5,714,039 A | 2/1998 | Beilstein, Jr. et al. | 156/657.1 |
| 6,022,815 A | * 2/2000 | Doyle et al. | 438/947 |
| 6,162,696 A | * 12/2000 | Cheng et al. | 438/312 |

* cited by examiner

Primary Examiner—Mark F. Huff
Assistant Examiner—Nicole Barreca
(74) Attorney, Agent, or Firm—Amin & Turocy, LLP

(57) ABSTRACT

In one embodiment, the present invention relates to a method of forming a circuit structure containing at least one sub-lithographic gate conductor involving the steps of providing a substrate comprising active regions and a preliminary gate conductor film over portions of the substrate and portions of the active regions; forming a sidewall template mask having at least one sidewall over a portion of the preliminary gate conductor film that is positioned over portions of the active regions; forming a sidewall film over the sidewall template mask, the sidewall film having a vertical portion adjacent the sidewall of the sidewall template mask and a horizontal portion in areas not adjacent the sidewall of the sidewall template mask; removing the horizontal portion of the sidewall film exposing a portion of the sidewall template mask and removing the sidewall template mask; providing a second mask over the portions of the preliminary gate conductor film that are not positioned over portions of the active regions; removing exposed portions of the preliminary gate conductor film thereby forming the circuit structure containing the sub-lithographic gate conductor and gate conductors; providing a trim mask over the active regions, portions of the sub-lithographic gate conductor and the gate conductors; and removing exposed portions of the sidewall film and portions of the preliminary gate conductor film under the sidewall film.

24 Claims, 17 Drawing Sheets

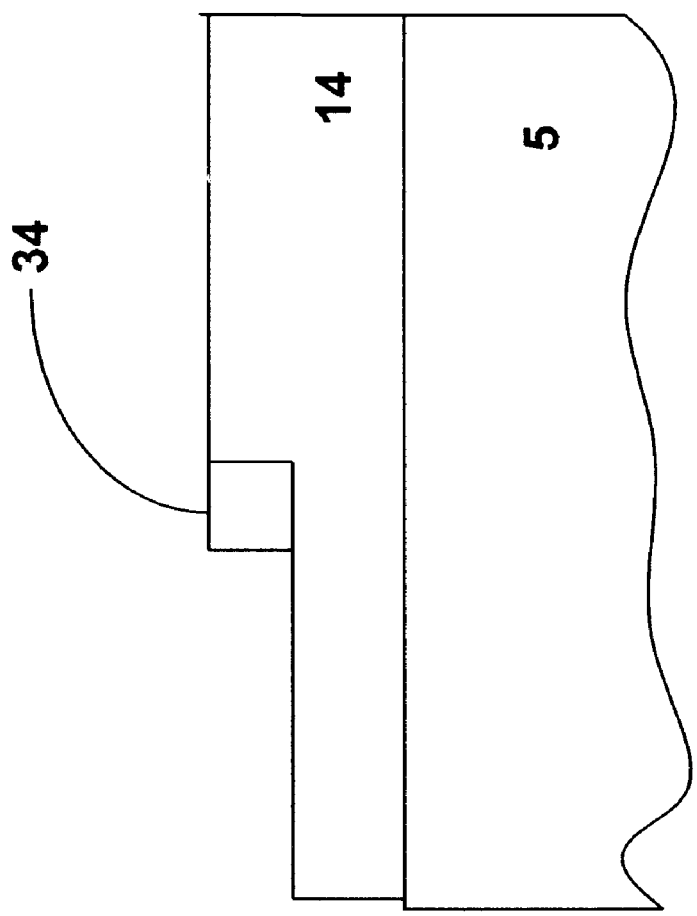

SIDEWALL PATTERNING FOR SUB 100 NM GATE CONDUCTORS

RELATED APPLICATIONS

This application is a continuation-in-part of applications Ser. No. 09/207,551 filed on Dec. 8, 1998 now U.S. Pat. No. 6,183,938; Ser. No. 09/234,379 filed on Jan. 20, 1999 now U.S. Pat. No. 6,214,737; Ser. No. 09/234,380 filed on Jan. 20, 1999 now U.S. Pat. No. 6,291,137; and Ser. No. 09/266,367 filed on Mar. 11, 1999, all of which are hereby incorporated by reference for their relevant teachings.

TECHNICAL FIELD

The present invention generally relates to making sub-lithographic gate conductors using sidewall patterning techniques.

BACKGROUND ART

In the semiconductor industry, there is a continuing trend toward higher device densities. To achieve these high densities there has been and continues to be efforts toward scaling down the device dimensions on semiconductor wafers. In order to accomplish such high device packing density, smaller and smaller features sizes are required. This includes the width and spacing of conductive features and the surface geometry such as corners and edges of various features. Since numerous conductive features are typically present on a semiconductor wafer, the trend toward higher device densities is a notable concern.

The requirement of small features (and close spacing between adjacent features) requires high resolution photolithographic processes. In general, lithography refers to processes for pattern transfer between various media. It is a technique used for integrated circuit fabrication in which a silicon slice, the wafer, is coated uniformly with a radiation-sensitive film, the resist, and an exposing source (such as optical light, X-rays, or an electron beam) illuminates selected areas of the surface through an intervening master template, the photomask, for a particular pattern. The lithographic coating is generally a radiation-sensitized coating suitable for receiving a projected image of the subject pattern. Once the image is projected, it is indelibly formed in the coating. The projected image may be either a negative or a positive of the subject pattern. Exposure of the coating through the photomask causes a chemical transformation in the exposed areas of the coating thereby making the image area either more or less soluble (depending on the coating) in a particular solvent developer. The more soluble areas are removed in the developing process to leave the pattern image in the coating as less soluble polymer.

Projection lithography is a powerful and essential tool for microelectronics processing. However, lithography is not without limitations. Patterning features having dimensions of about 0.25 $\mu$m or less with acceptable resolution is difficult at best, and impossible in some circumstances. Patterning conductive features including conductive lines and conductive silicon substances (such as amorphous silicon and polysilicon) with small dimensions is required in order to participate in the continuing trend toward higher device densities. Procedures that increase resolution, improved critical dimension control, and provide small conductive features are therefore desired.

SUMMARY OF THE INVENTION

The present invention provides methods of forming sub-lithographic gate conductors using sidewall patterning techniques. The sub-lithographic gate conductors may be formed into any type of electrical structure including a memory cell, such as a static random access memory (SRAM) cell. The width of the gate conductors formed in accordance with the present invention is dependent upon sidewall deposition techniques rather than photolithography techniques. In other words, the width of the gate conductors is determined mainly by the limitations of sidewall deposition techniques rather than the limitations of photolithography techniques. As a result, sub-lithographic gate conductors may be formed in a reliable manner. The present invention therefore effectively addresses the concerns raised by the trend towards the miniaturization of semiconductor devices.

In one embodiment, the present invention relates to a method of forming a circuit structure containing at least one sub-lithographic gate conductor involving the steps of providing a substrate comprising active regions and a preliminary gate conductor film over portions of the substrate and portions of the active regions; forming a sidewall template mask having at least one sidewall over a portion of the preliminary gate conductor film that is positioned over portions of the active regions; forming a sidewall film over the sidewall template mask, the sidewall film having a vertical portion adjacent the sidewall of the sidewall template mask and a horizontal portion in areas not adjacent the sidewall of the sidewall template mask; removing the horizontal portion of the sidewall film exposing a portion of the sidewall template mask and removing the sidewall template mask; providing a second mask over the portions of the preliminary gate conductor film that are not positioned over portions of the active regions; removing exposed portions of the preliminary gate conductor film thereby forming the circuit structure containing the sub-lithographic gate conductor and gate conductors; providing a trim mask over the active regions, portions of the sub-lithographic gate conductor and the gate conductors; and removing exposed portions of the sidewall film and portions of the preliminary gate conductor film under the sidewall film.

In another embodiment, the present invention relates to a method of forming a circuit structure containing at least one sub-lithographic gate conductor involving the steps of providing a substrate comprising active regions and a preliminary gate conductor film over portions of the substrate and portions of the active regions, the preliminary gate conductor film comprising one of polysilicon and amorphous silicon; forming a sidewall template mask having at least one sidewall over a portion of the preliminary gate conductor film that is positioned over portions of the active regions; forming a sidewall film over the sidewall template mask, the sidewall film having a vertical portion adjacent the sidewall of the sidewall template mask and a horizontal portion in areas not adjacent the sidewall of the sidewall template mask; removing the horizontal portion of the sidewall film exposing a portion of the sidewall template mask and removing the sidewall template mask; providing a second mask over portions of the preliminary gate conductor film that are not positioned over portions of the active regions; removing exposed portions of the preliminary gate conductor film thereby forming the circuit structure containing the sub-lithographic gate conductor having a width of about 200 nm or less and gate conductors; providing a trim mask over the active regions, portions of the sub-lithographic gate conductor and the gate conductors; and removing exposed portions of the sidewall film and portions of the preliminary gate conductor film under the sidewall film.

In yet another embodiment, the present invention relates to a method of forming a circuit structure containing at least one sub-lithographic gate conductor involving the steps of providing a substrate comprising active regions and a preliminary gate conductor film over portions of the substrate and portions of the active regions, the preliminary gate conductor film comprising one of polysilicon and amorphous silicon; etching a portion of the preliminary gate conductor film that is positioned over portions of the active regions forming a sidewall in the preliminary gate conductor film over portions of the active regions; forming a sidewall film over the preliminary gate conductor film, the sidewall film having a vertical portion adjacent the sidewall of the preliminary gate conductor film and a horizontal portion in areas not adjacent the sidewall of the preliminary gate conductor film; removing the horizontal portion of the sidewall film exposing portions of the preliminary gate conductor film; providing a mask over portions of the preliminary gate conductor film that are not over portions of the active regions; removing exposed portions of the preliminary gate conductor film forming the circuit structure containing the sub-lithographic gate conductor having a width of about 200 nm or less and gate conductors; providing a trim mask over the active regions, portions of the sub-lithographic gate conductor and the gate conductors; and removing exposed portions of the sidewall film and portions of the preliminary gate conductor film under the sidewall film.

In still yet another embodiment, the present invention relates to a method of forming a memory cell comprising a sub-lithographic gate conductor involving the steps of providing a substrate comprising active regions and a preliminary gate conductor film over portions of the substrate and portions of the active regions, the preliminary gate conductor film comprising polysilicon; forming a sidewall template mask over a portion of the preliminary gate conductor film, the sidewall template mask having at least one sidewall on a portion of the preliminary gate conductor film that is positioned over portions of the active regions; forming a sidewall film over the sidewall template mask, the sidewall film having a vertical portion adjacent the sidewall of the sidewall template mask and a horizontal portion in areas not adjacent the sidewall of the sidewall template mask; removing the horizontal portion of the sidewall film exposing a portion of the sidewall template mask using anisotropic etching; removing the exposed portions of the sidewall template mask exposing portions of the preliminary gate conductor film using anisotropic etching; providing a second mask over the substrate and portions of the preliminary gate conductor film that are not over portions of the active regions; removing exposed portions of the preliminary gate conductor film thereby forming a memory cell comprising the sub-lithographic gate conductor having a transistor channel length of about 200 nm or less and gate conductors having a width larger than the transistor channel length of the sub-lithographic gate conductor; providing a trim mask over the active regions, portions of the sub-lithographic gate conductor and the gate conductors; and removing the vertical portion of the sidewall film and portions of the preliminary gate conductor film under the sidewall film.

BRIEF DESCRIPTION OF DRAWINGS

FIG. 12B illustrates a cross-sectional view of a portion of FIG. 12A according to one aspect of the present invention.

DISCLOSURE OF INVENTION

Figure 1:
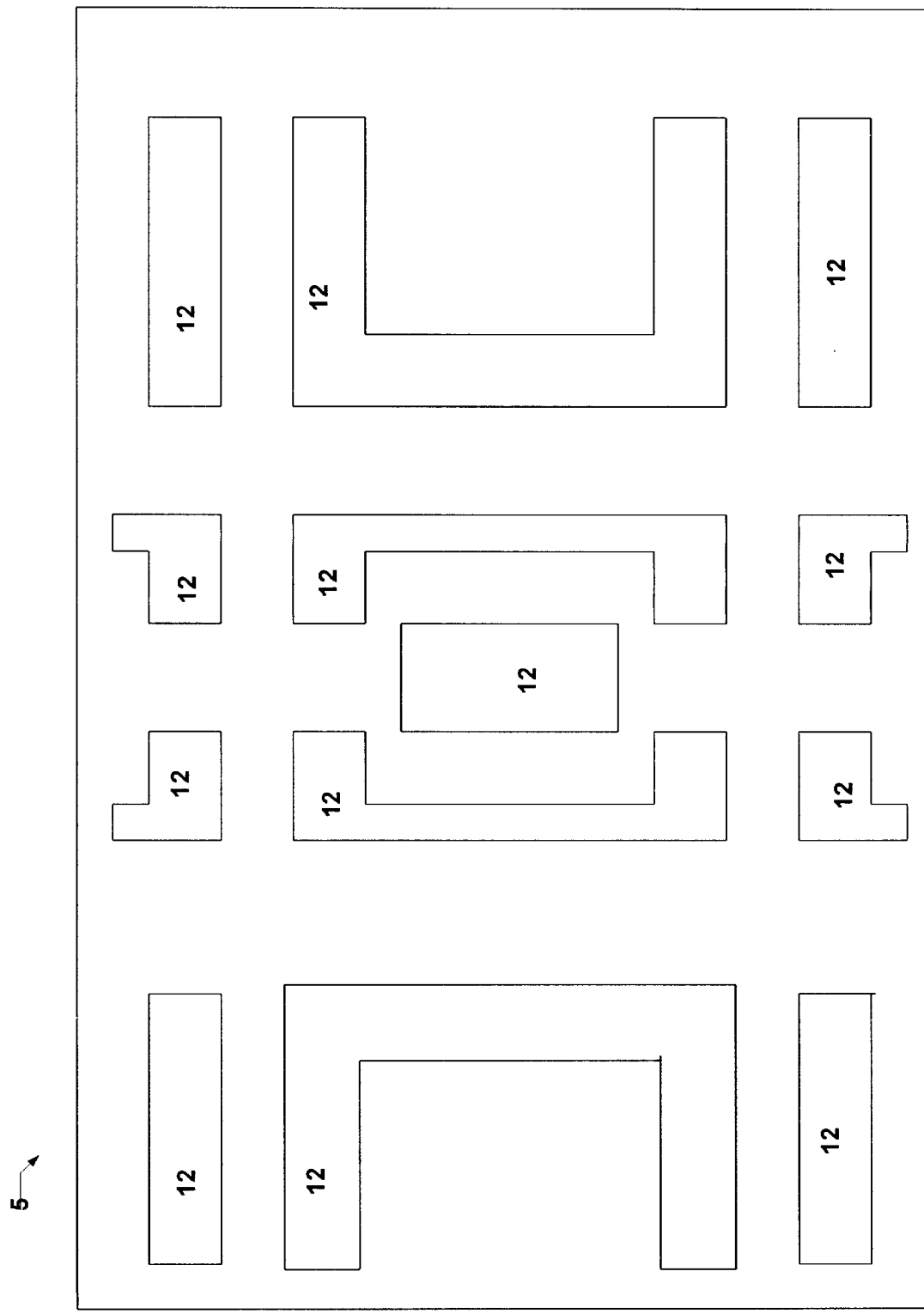
FIG. 1 illustrates a plan view of an initial substrate according to one aspect of the methods according to the present invention.

The present invention involves methods of forming sub-lithographic gate conductors in a simple and efficient manner. The present invention more specifically involves making sub-lithograph gate conductors by sidewall patterning of a template film. The gate conductors are used, amongst other structures and regions, to form circuit patterns and other electrical structures such as memory cells.

A preliminary gate conductor film is provided over a portion of a substrate. In this connection, the preliminary gate conductor film is preliminary in the sense that processing in accordance with the present invention transforms the preliminary gate conductor film into a relatively narrow gate conductor in that it may have sub-lithographic dimensions. The gate conductor film contains a material that conducts or semiconducts electrical current. The gate conductor film typically includes silicon layers, such as polysilicon and amorphous silicon.

The substrate is typically a silicon substrate optionally with various elements, regions and/or layers thereover; including metal layers, barrier layers, dielectric layers, device structures, active regions such as active silicon regions or areas, active elements and passive elements including additional polysilicon gates, wordlines, source regions, drain regions, bit lines, bases, emitters, collectors, conductive lines, conductive plugs, etc. Active regions also include active silicon (doped, undoped, or that may be doped) and active silicon covered with a thin gate dielectric material. The gate conductor film is provided over a portion of the substrate or over the entire substrate.

The preliminary gate conductor film may be formed in any suitable manner. The thickness of the preliminary gate conductor film is typically from about 300 Å to about 3,000 Å. In another embodiment, the thickness of the preliminary gate conductor film is from about 500 Å to about 2,500 Å. In another embodiment, the thickness of the preliminary gate conductor film is from about 750 Å to about 2,000 Å.

A sidewall template is provided over a portion of the preliminary gate conductor film; while portions of the preliminary gate conductor film remain exposed. Alternatively, the sidewall template is provided within the preliminary gate conductor film (a surface modified preliminary gate conductor film as discussed below). The sidewall template is provided over a portion of the preliminary gate conductor film or over the entire preliminary gate conductor film and etched back so that the sidewall template has at least one sidewall substantially perpendicular to the substrate surface and the preliminary gate conductor film surface. The sidewall is a step that is substantially perpendicular to the substrate surface and the preliminary gate conductor film surface. The sidewall template is etched back or patterned using suitable photolithographic techniques. In most embodiments, the sidewall template has two or more sidewalls substantially perpendicular to the substrate surface and the preliminary gate conductor film surface.

The sidewall template contains a material that may be formed into a pattern. Examples of sidewall template materials include silicon containing materials, such as silicon oxide, silicon nitride and silicon oxynitride; nitrogen rich films; photoresist materials; low K polymer materials; and in one embodiment, a surface modified preliminary gate conductor. Low K polymer materials are materials having low dielectric constants and include polyimides, fluorinated polyimides, polysilsequioxane, benzocyclobutene (BCB), parlene F, parlene N and amorphous polytetrafluoroethylene. A specific example of a commercially available low K polymer material is Flare™ from AlliedSignal believed to be derived from perfluorobiphenyl and aromatic bisphenols.

The nitrogen rich film is a layer containing a substantial amount of nitrogen. Examples of nitrogen rich films include nitride films such as silicon nitride, nitride rich silicon oxynitride, titanium nitride, tantalum nitride, and tungsten nitride. The nitrogen rich film is formed in any suitable manner, including CVD techniques. CVD techniques include low pressure chemical vapor deposition (LPCVD) and plasma enhanced chemical vapor deposition (PECVD). For example, a silicon nitride film may be made by PECVD or LPCVD employing gases containing silicon and nitrogen, such as using $SiH_4$ or $SiCl_2H_2$ and $N_2$ or $NH_3$. In one embodiment, the nitrogen rich film is a silicon nitride layer made by LPCVD techniques employing $SiCl_2H_2$ and $NH_3$. In another embodiment, the nitrogen rich film is a silicon nitride layer made by PECVD techniques employing $SiH_4$ and $NH_3$.

The photoresist material used as sidewall template is conventionally processed (exposed and developed). The photoresist material contains an organic material that may be formed into a pattern. Any organic photoresist material may be applied to the gate conductor by any suitable means. For example, a 157 nm sensitive photoresist material, a 193 nm sensitive photoresist material, an I-line material, H-line material, G-line material, deep UV material, extreme UV or chemically amplified photoresist material may be spin-coated on the gate conductor film. Positive or negative photoresist materials may be used. Photoresist materials are commercially available from a number of sources, including Shipley Company, Kodak, Hoechst Celanese Corporation, DuPont, Clariant, JSR Microelectronics, Hunt, Arch Chemical, Aquamer, and Brewer.

The sidewall template may be made in any suitable manner, including chemical vapor deposition (CVD) techniques (in the case of silicon containing materials) or spin coating (in the case of photoresist materials and low K polymer materials. CVD techniques include low pressure chemical vapor deposition (LPCVD) and plasma enhanced chemical vapor deposition (PECVD). In one embodiment, a silicon nitride film may be made by PECVD or LPCVD employing gases containing silicon and nitrogen, such as using $SiH_4$ or $SiCl_2H_2$ and $N_2$ or $NH_3$. In another embodiment, a silicon oxide film may be made by PECVD or LPCVD employing gases containing silicon and oxygen, such as using $SiH_4$ or $SiCl_2H_2$ and $N_2O$ or $O_2$ In yet another embodiment, a silicon oxynitride film may be made by PECVD or LPCVD employing gases containing silicon, oxygen and nitrogen, such as using $SiH_4$ and $N_2O$ and $NH_3$.

In embodiments where the sidewall template is a surface modified preliminary gate conductor film, the preliminary gate conductor film is partially etched to form a step or sidewall therein. The step or surface modification of the preliminary gate conductor film is made by providing a mask over a portion of the preliminary gate conductor film wherein portions of the preliminary gate conductor film are exposed. In this connection, the mask acts as a sidewall template mask. The mask is provided over a portion of the preliminary gate conductor film or over the entire preliminary gate conductor film and etched back so that the mask has at least one sidewall substantially perpendicular to the substrate surface and preliminary gate conductor film surface. In most embodiments, the mask has two or more sidewalls substantially perpendicular to the substrate surface and preliminary gate conductor film surface. The mask contains a material that is easily formed into a pattern, such as a photoresist.

The exposed portions of the preliminary gate conductor film are partially etched wherein at least one step is formed in the preliminary gate conductor film. Dry or wet etching techniques may be employed. In a preferred embodiment, dry etch techniques are used. In one embodiment, the preliminary gate conductor film is partially etched using an anisotropic etching process. In another preferred embodiment, reactive ion etching (RIE) is employed. The specific etchant depends upon the specific identity of the gate conductor film material. Dry etch techniques typically involve using a plasma containing fluorine or chlorine compounds, such as one or more of $BCl_3$, $CCl_4$, $SiCl_4$, $Cl_2$, HBr, $NF_3$, $SF_6$, $CH_3F$, $CF_4$ and $CHF_3$.

The amount of the preliminary gate conductor film etched or removed varies depending upon the desired height of the resultant sub 200 nm gate conductor. Partial etching removes about 10% to about 75% of the thickness of the exposed portions of the preliminary gate conductor film. In another embodiment, partial etching removes about 20% to about 60% of the thickness of the exposed portions of the preliminary gate conductor film. In yet another embodiment, partial etching removes about 30% to about 50% of the thickness of the exposed portions of the preliminary gate conductor film. Thus, the thickness of the exposed portions of the preliminary gate conductor after etching is from about 125 Å to about 2,700 Å. The removed portions of the preliminary gate conductor film form one or more steps or sidewalls therein. After the preliminary gate conductor film is partially etched, the preliminary gate conductor film may contain a series of plateau like regions. The mask is stripped or removed from the substrate using any suitable technique.

The thickness of the sidewall template is selected so that a vertical portion of the sidewall film (described later) is large enough to effectively act as a preliminary gate conductor mask. In one embodiment, the sidewall template has a thickness from about 500 Å to about 10,000 Å. In another embodiment, the sidewall template has a thickness from about 1,000 Å to about 5,000 Å. In yet another embodiment, the sidewall template has a thickness from about 1,500 Å to about 3,000 Å. These embodiments do not apply to the embodiment where the sidewall template is a surface modified preliminary gate conductor film. In a preferred embodiment where the sidewall template is a photoresist material, the photoresist material contains a deep UV or extreme UV photoresist material. Deep UV and extreme UV photoresist materials can be easily deposited and developed at thicknesses from about 500 Å to about 10,000 Å, and particularly from about 1,500 Å to about 3,000 Å.

In an optional embodiment, depending on the temperature requirements for formation of the sidewall film discussed below, the photoresist material pattern may be thermally stabilized prior to sidewall film formation using known techniques, such as deep UV/thermal stabilization, photostabilization and/or deep UV curing. In one embodiment, the photoresist material pattern is thermally stabilized prior to sidewall film deposition using plasma enhanced chemical vapor deposition (PECVD) techniques when the photoresist material is a deep UV photoresist material.

A sidewall film is deposited over all or the portion of the preliminary gate conductor film partially covered by the sidewall template (at least over the sidewall template). In a preferred embodiment, the sidewall film is deposited only over the sidewall template through a mask opening exposing the sidewall template. The sidewall film conforms to the profile of the sidewall template; that is, the sidewall film is formed in a substantially uniform thickness over the sidewall template.

The sidewall film is selected so that there is etch selectivity between the gate conductor film, the sidewall template and the sidewall film. For gate conductors of silicon layers (polysilicon or amorphous silicon), sidewall films of one or more of an acid catalyzed photoresist (or the thin desensitized resist layer remnants of an acid catalyzed photoresist), silicon oxide, silicon oxynitride and silicon nitride are employed. In one embodiment, the sidewall film contains a silicon containing film (one of silicon oxide, silicon oxynitride and silicon nitride). Although the sidewall template may, in some embodiments, contain a silicon containing film, the sidewall template and the sidewall film are made of different materials. The sidewall film may be made in any suitable manner, including CVD and spin-on techniques described above.

The acid catalyzed photoresist contains an acid catalyzed resin material. The acid catalyzed resin material undergoes a chemical change upon exposure to actinic radiation. More particularly, an acid catalyzed resin material contains a photoacid generator that generates an acid upon exposure to activating radiation. Photoacid generating compounds include aromatic substituted halohydrocarbons (such as 1,1-bis(p-chlorophenyl)-2,2,2-trichloroethane), halo-substituted sulfur containing compounds, haloheterocyclic compounds, onium salts (such as diaryl diazonium salts), sulfonated esters, and sulfonated ketones. In one embodiment, the acid catalyzed resin material is a chemically amplified photoresist.

Any suitable wavelength of radiation may be employed to expose the acid catalyzed photoresist so long as an acid catalyzed resin material is used. For example, radiation having wavelengths from about 1 nm to about 500 nm may be employed. Acid catalyzed resin photoresists may include a 157 nm sensitive photoresist, a 193 nm sensitive photoresist, an I-line, H-line, G-line, E-line, mid UV, deep UV or an extreme UV photoresist material. Deep UV photoresists are preferred. Acid catalyzed photoresists are commercially available from a number of sources, including Shipley Company, Kodak, Clariant, JSR Microelectronics, Hoechst Celanese Corporation, Dupont, Hunt, Arch Chemical, Aquamer, and Brewer. A specific example of a deep UV acid catalyzed photoresist is a combination of a partially t-butoxycarbonyloxy substituted poly-p-hydroxystyrene and a photoacid generator.

The acid catalyzed photoresist may be deposited using any suitable means on the sidewall template including spin-coating techniques. The acid catalyzed photoresist is applied to any suitable thickness as the thickness is not critical to the invention. In one embodiment, the acid catalyzed photoresist is applied to a thickness from about 200 Å to about 10,000 Å. In another embodiment, the acid catalyzed photoresist is applied to a thickness from about 1,000 Å to about 5,000 Å.

In embodiments where the acid catalyzed photoresist is in contact with a sidewall template containing a nitrogen rich film, a chemical interaction takes place within the portions of the acid catalyzed photoresist adjacent the sidewall template forming a thin desensitized resist layer within the acid catalyzed photoresist. Although not wishing to be bound by any theory, it is believed that nitrogen atoms from the sidewall template poison a thin portion of the acid catalyzed photoresist adjacent the sidewall template. More particularly, it is believed that nitrogen atoms at the interface of the sidewall template and the acid catalyzed photoresist act as a Lewis base neutralizing the photogenerated acid preventing chemical change (acid catalysis) following exposure to actinic radiation. Thus, a thin desensitized resist layer is formed within the acid catalyzed photoresist which is identifiable after the remaining portions of the acid catalyzed photoresist are removed or developed. The time which the sidewall template is permitted to poison the acid catalyzed photoresist is not critical because the poisoning typically does not extend beyond about 2,000 Å into the acid catalyzed photoresist. Nevertheless, in an exemplary process the acid catalyzed photoresist and the sidewall template are in contact for a time period from about 10 seconds to about 3 hours, although slightly shorter or longer times may be permitted.

The acid catalyzed photoresist is flood or blanket exposed (the entire acid catalyzed photoresist coated substrate is exposed without a mask) to suitable actinic radiation, and the acid catalyzed photoresist is developed with a developer removing the unpoisoned portions of the acid catalyzed photoresist leaving a thin desensitized resist layer adjacent the sidewall template. Any developer may be used to remove the exposed and unpoisoned portions of the acid catalyzed photoresist including aqueous alkaline developers. Aqueous alkaline developers typically contain a hydroxide compound, such as tetramethylammonium hydroxide. The thin desensitized resist layer is then optionally rinsed or cleaned.

The thickness of the sidewall film is selected or provided depending upon the desired width of the resultant sublithographic gate conductor. In one embodiment, the sidewall film has a thickness from about 100 Å to about 2,000

Å. In another embodiment, the sidewall film has a thickness from about 200 Å to about 1,500 Å. In yet another embodiment, the sidewall film has a thickness from about 300 Å to about 1,000 Å. In one embodiment, the thickness of the sidewall film is substantially uniform around the sidewall template in that the thickness does not vary by more than about 50 Å comparing the thickest and thinnest areas of the sidewall film.

In embodiments where the sidewall template is one of a silicon containing material, a photoresist material, a low K polymer material, and a surface modified preliminary gate conductor, the sidewall film is preferably a silicon containing film. In embodiments where the sidewall template is a nitrogen rich film, the sidewall film is preferably an acid catalyzed photoresist. Specific preferred combinations of sidewall templates and sidewall films include a silicon oxide sidewall template and a silicon nitride sidewall film; a silicon nitride sidewall template and a silicon oxide sidewall film; a silicon oxide sidewall template and a silicon oxynitride sidewall film; a silicon nitride sidewall template and a silicon oxynitride sidewall film; a silicon oxynitride sidewall template and a silicon nitride sidewall film; a silicon oxynitride sidewall template and a silicon oxide sidewall film; a low K polymer material sidewall template and a silicon oxynitride sidewall film; a low K polymer material sidewall template and a silicon nitride sidewall film; a low K polymer material sidewall template and a silicon oxide sidewall film; a photoresist material sidewall template and a silicon oxynitride sidewall film; a photoresist material sidewall template and a silicon nitride sidewall a photoresist material sidewall template and a silicon oxide sidewall film; a surface modified preliminary gate conductor sidewall template and a silicon oxynitride sidewall film; a surface modified preliminary gate conductor sidewall template and a silicon nitride sidewall film; a surface modified preliminary gate conductor sidewall template and a silicon oxide sidewall film; and a nitrogen rich film sidewall template and an acid catalyzed photoresist sidewall film.

For purposes of this invention, there are two main portions of the sidewall film. The first is a portion of the sidewall film adjacent the sidewall(s) of the sidewall template and is referred to herein as the vertical portion. The second is a portion of the sidewall film that covers the flat surfaces (parallel or substantially parallel to the plane of the flat surface of the substrate) of the sidewall template and the gate conductor film and is referred to herein as the horizontal portion(s).

A directional etch is performed to remove portions of the sidewall film covering the flat surfaces of the sidewall template and preliminary gate conductor film (the horizontal portions as defined above) while not substantially removing the vertical portion of the sidewall film adjacent the sidewalls of the sidewall template. Dry or wet etching techniques may be employed. In a preferred embodiment, a dry anisotropic etch process is employed whereby the horizontal portions of the sidewall film are removed. In one embodiment, a RIE technique is employed. In a preferred embodiment, dry etch techniques are used. The specific etchant depends upon the specific identity of the sidewall film material. Dry etch techniques typically involve using a plasma containing one or more fluorine compounds for silicon containing films, such as one of $NF_3$, $SF_6$, $CH_3F$, $C_4F_8$, $CF_4$ and $CHF_3$ and an oxidizing plasma, such as an oxygen gas or sulfur gas, for the acid catalyzed photoresist. The etch technique is selected so that the sidewall template and preliminary gate conductor film are not significantly etched or degraded. In this connection, the sidewall template and preliminary gate conductor film act as etch stop layers when performing the directional etch of the sidewall film.

While the directional etch removes the horizontal portions of the sidewall film, a small amount of the vertical portion of the sidewall film may be also removed. However, in most instances, the small amount of the vertical portion removed substantially corresponds with the thickness of the sidewall film thus leaving a vertical portion of the sidewall film (having a height) equal to or slightly less than the height of the thickness of the sidewall template). Typically, the height of the vertical portion of the sidewall film is slightly less (from about 1% to about 20% less based upon the height of the step) than the height of the sidewall template. All or substantially all (from about 80% to about 99% of the original height) of the vertical portion of the sidewall film remains positioned adjacent the sidewall template.

After directional etch of the horizontal portions of the sidewall film, the sidewall template is removed or stripped. Dry or wet etching techniques may be employed. In a one embodiment, a dry anisotropic etch process is employed to remove the sidewall template. In one embodiment, a RIE technique is employed. In a preferred embodiment, dry etch techniques are used. In another embodiment, wet etch techniques using an acid, such as hydrofluoric acid or phosphoric acid are employed. The specific etchant depends upon the specific identity of the sidewall template material. Dry etch techniques typically involve using a plasma containing one or more fluorine compounds, such as one of $NF_3$, $SF_6$, $CH_3F$, $C_4F_8$, $CF_4$ and $CHF_3$ when the sidewall template is a silicon containing material, one of $NF_3$, $SF_6$, $CH_3F$, $CF_4$ and $CHF_3$ when the sidewall template is a nitrogen rich film, or an oxygen containing compound, such as $O_2$, when the sidewall template is a photoresist material or low K polymer material. The etch technique is selected so that the vertical portion of the sidewall film and the gate conductor film are not significantly etched or degraded. In this connection, the gate conductor film and portions of the underlying substrate act an as etch stop layer when performing the directional etch of the sidewall template.

A photoresist mask is formed over the substrate, leaving exposed the portion of the preliminary gate conductor film that is subsequently etched to form a patterned gate conductor. The preliminary gate conductor film covered by the photoresist mask typically corresponds to the field poly pattern so desired. The photoresist mask also protects other areas of the substrate during etching of the preliminary gate conductor film. Suitable photolithography techniques may be employed to form the photoresist mask exposing a portion of the preliminary gate conductor film.

The exposed portions of the preliminary gate conductor film are etched in a directional manner wherein the remaining vertical portion of the sidewall film and the photoresist mask act as a mask for the preliminary gate conductor film located underneath it. In one embodiment, the exposed portions of the preliminary gate conductor film are etched using an anisotropic etching process. In another preferred embodiment, a RIE is employed. Dry or wet etching techniques may be employed. In a preferred embodiment, dry etch techniques are used. The specific etchant depends upon the specific identity of the gate conductor material. Dry etch techniques typically involve using a plasma containing fluorine or chlorine compounds, such as one or more of $BCl_3$, $CCl_4$, $SiCl_4$, $Cl_2$, $NF_3$, $SF_6$, $CH_3F$, $CF_4$ and $CHF_3$. The etch technique is selected so that the vertical portion of the sidewall film or the underlying substrate is not etched or significantly etched or degraded.

Generally speaking, the etch techniques for the directional etch of the horizontal portions of the sidewall film, the removal of the sidewall template (if etch techniques are used) and the etch of the preliminary gate conductor film are selected so that at least about 2:1 etch selectivity is achieved between the one material and the other material(s). In a preferred embodiment, the etch techniques for the directional etch of the horizontal portions of the sidewall film, the removal of the sidewall template (if etch techniques are used) and the etch of the preliminary gate conductor film are selected so that at least about 3:1 etch selectivity is achieved between the one material and the other material(s). In a more preferred embodiment, the etch techniques for the directional etch of the horizontal portions of the sidewall film, the removal of the sidewall template (if etch techniques are used) and the etch of the preliminary gate conductor film are selected so that at least about 5:1 etch selectivity is achieved between the one material and the other material(s).

Remaining on the substrate is one or more lines (depending upon the shape of the patterning of the sidewall template) of the gate conductor underneath the vertical portions of the sidewall film constituting a sub-lithographic gate conductor and underneath the photoresist mask constituting "regular" portions of the gate conductor. The remaining vertical portion of the sidewall film may be stripped or removed from the gate conductor and other portions of the substrate leaving a sub-lithographic gate conductor using a sidewall trim mask.

The preliminary gate conductor is formed into a desired pattern. The patterned gate conductor can form a circuit or other electrical structure, such as a memory cell. The width of the patterned gate conductor depends upon whether the photoresist mask or the sidewall film is used to form that particular portion. More particularly, the patterned gate conductor has at least two widths, one corresponding to the portion formed by the photoresist mask and one corresponding to the portion formed by the sidewall film.

The width of the gate conductor formed under the photoresist mask is larger than the width or transistor channel length of the sub-lithographic gate conductor, regardless of the size of the sub-lithographic gate conductor.

The dimensions of the thinned portion of the resulting sub-lithographic gate conductor depend primarily upon the specific identity of the sidewall film material and the thickness of the sidewall film. The dimensions of the resulting sub-lithographic gate conductor may be from about 100 Å to about 2,000 Å in width (a width of about 200 nm or less) and from about 300 Å to about 3,000 Å in height. In another embodiment, the dimensions of the resulting sub-lithographic gate conductor are from about 200 Å to about 1,500 Å in width (a width of about 150 nm or less) and from about 500 Å to about 2,500 Å in height. In yet another embodiment, the dimensions of the resulting sub-lithographic gate conductor are from about 300 Å to about 1,000 Å in width (a width of about 100 nm or less) and from about 750 Å to about 2,000 Å in height. In some embodiments, the width of the resulting sub-lithographic gate conductor is about 75 nm or less, and even 50 nm or less.

The resulting sub-lithographic gate conductor made in accordance with the present invention may be useful for subsequent processing of the substrate on which it is positioned. For example, the sub-lithographic gate conductor made in accordance with the present invention may be used for forming an integrated circuit chip having markedly more transistors compared to integrated circuit chips made using conventional techniques. Specifically, the sub-lithographic gate conductor made in accordance with the present invention may be used for forming transistors of extremely small size.

Several embodiments of the present invention are now described in connection with the figures. The embodiments are described in the context of forming, by example, an SRAM cell layout. Therefore, it is understood that type of layout containing sub-lithographic gate conductors may be made in accordance with the present invention.

Referring to FIGS. 1–8, a first group of embodiments are described. Referring to FIG. 1, a substrate 5 is provided having a field oxide 10, active regions 12, and gate conductor film (not shown) thereover or therein in a layout of an SRAM cell. The gate conductor film is not shown since it covers the entire substrate in this embodiment (although portions are shown later). The active regions 12 subsequently form source/drain regions and are active silicon covered with a thin gate dielectric material, such as silicon dioxide. The gate conductor contains polysilicon or amorphous silicon, but in this embodiment, gate conductor comprises amorphous silicon. Although the substrate may optionally or additionally have various elements, regions and/or layers thereover including metal layers, barrier layers, dielectric layers, device structures, active regions such as active silicon regions or areas, active elements and passive elements including additional polysilicon gates, wordlines, source regions, drain regions, bit lines, bases, emitters, collectors, conductive lines, conductive plugs, only a field oxide 10 and an active region 12 are shown. The thickness of the gate conductor film is from about 300 Å to about 3,000 Å, and in this embodiment, about 1,000 Å.

Figure 2:
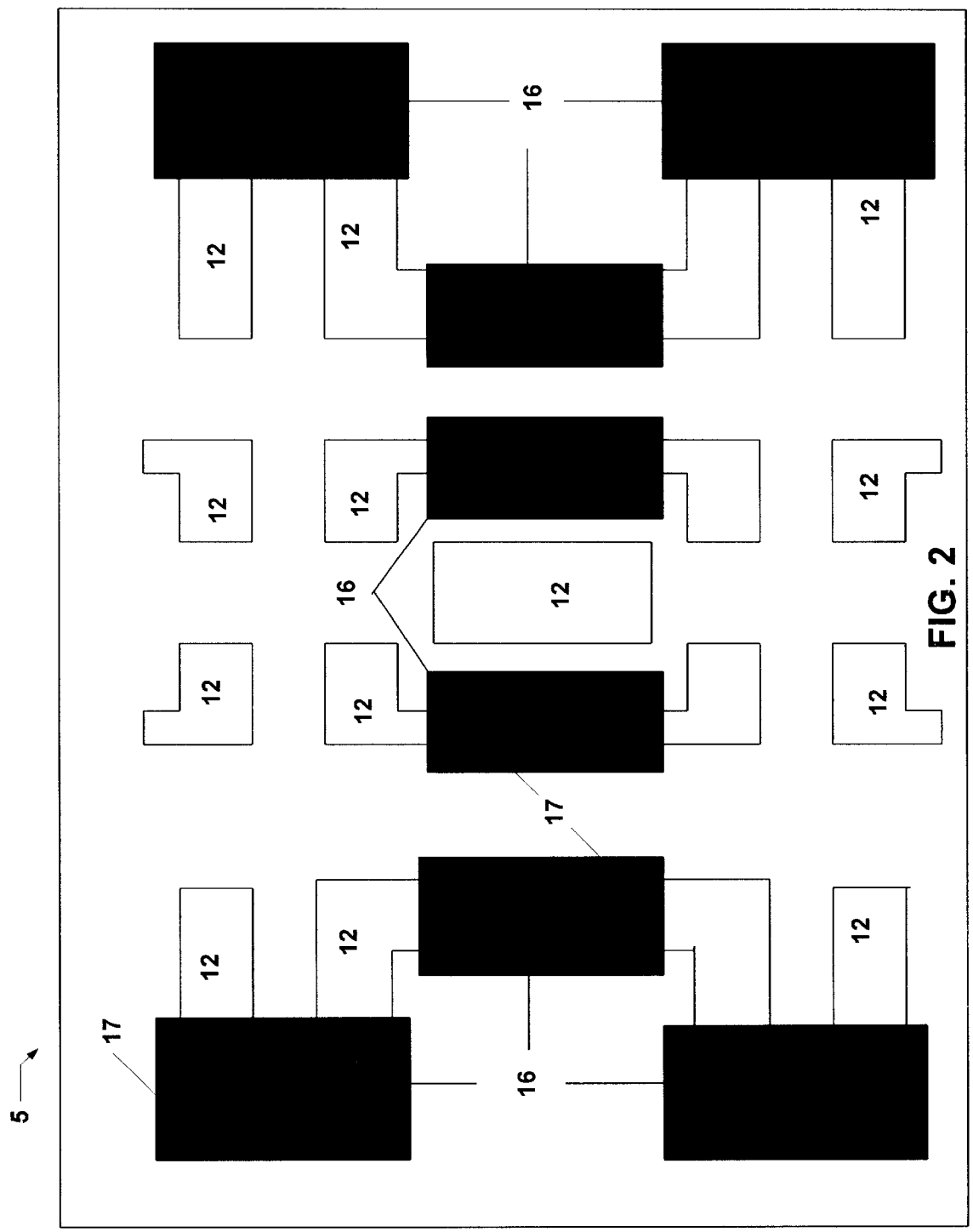
FIG. 2 illustrates a plan view of a sidewall template according to one aspect of the present invention.

Referring to FIG. 2, sidewall templates 16 (represented by the black rectangle) are provided over a portion of the gate conductor film wherein portions of the gate conductor film are exposed and other portions covered. Specifically, the sidewall template is provided over the entire substrate 5 and etched back so that the sidewall templates 16 have at least one sidewall 17 (represented by the outer edge of the black rectangle) substantially perpendicular to the substrate surface and specifically the gate conductor film surface (for clarity, not all sidewalls 17 are indicated in FIG. 2). The sidewall template is deposited by suitable spin-coating techniques, and etched back or patterned using suitable photolithographic techniques. The sidewall template 16 contains any of a number of materials including silicon containing materials, nitrogen rich films, photoresist materials, and low K polymer materials. In this embodiment, the sidewall templates 16 contain a low K polymer material such as Flare™ available from AlliedSignal. The thickness of the sidewall templates 16 is from about 500 Å to about 10,000 Å and in this embodiment, about 2,000 Å.

Figure 3:
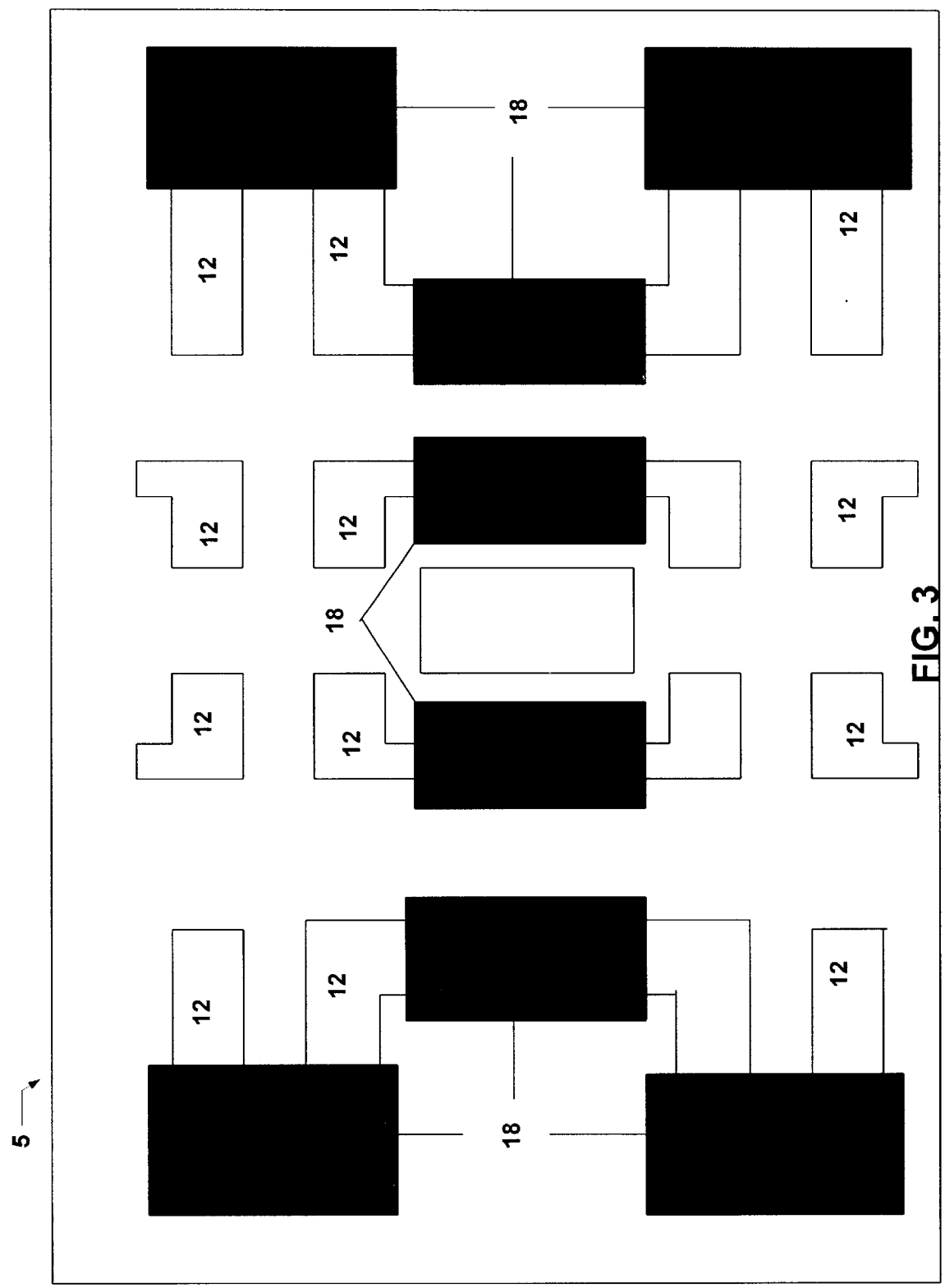
FIG. 3 illustrates a plan view of a sidewall film according to one aspect of the present invention.

Referring to FIG. 3, a sidewall film 18 is deposited over at least the portion of the gate conductor film partially covered by the sidewall template 16, and typically over the entire substrate 5. The sidewall film 18 conforms to the profile of the sidewall template 16; that is, the sidewall film 18 is formed in a substantially uniform thickness over the sidewall template 16 wherein sidewall 17 continues to be definable (for clarity, not all sidewalls 17 are indicated in FIG. 3). The sidewall film 18 is selected so that there is etch selectivity between the gate conductor film, the sidewall template 16 and the sidewall film 18. In this embodiment, the sidewall films 18 contain a silicon containing film such as silicon oxynitride. The sidewall film is made by CVD techniques. The thickness of the sidewall film 18 is typically from about 100 Å to about 2,000 Å and in this embodiment, about 500 Å.

There are two main portions of the sidewall films 18. The first is a vertical portion of the sidewall films 18 adjacent the sidewall 17 of the sidewall templates 16. The second is a horizontal portion of the sidewall films 18 that covers the flat surfaces (parallel or substantially parallel to the plane of the flat surface of the substrate 5) of the sidewall templates 16 and the gate conductor film.

Figure 4A:
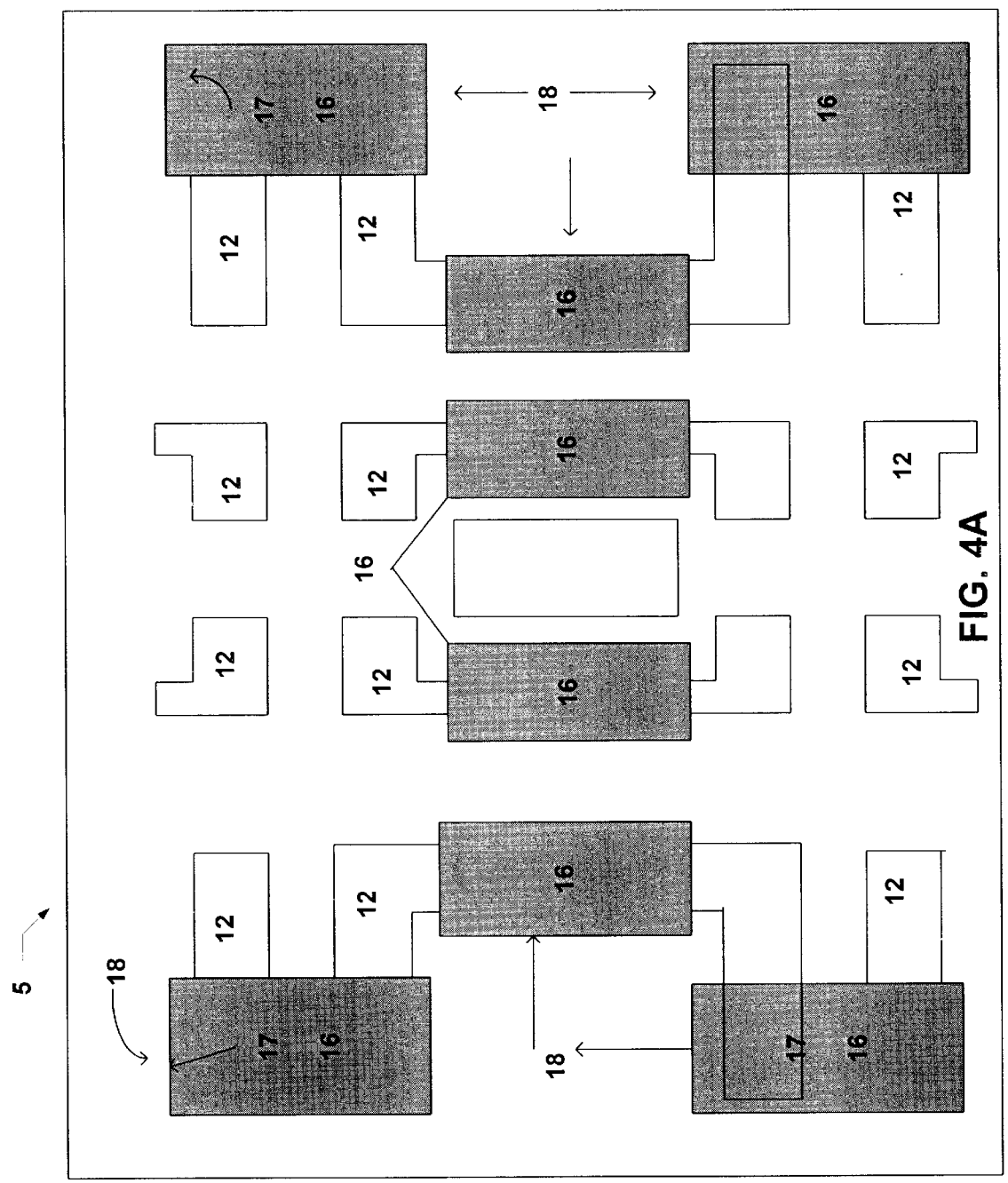
FIG. 4A illustrates a plan view of a sidewall patterned sidewall film according to one aspect of the present invention.
Figure 4B:
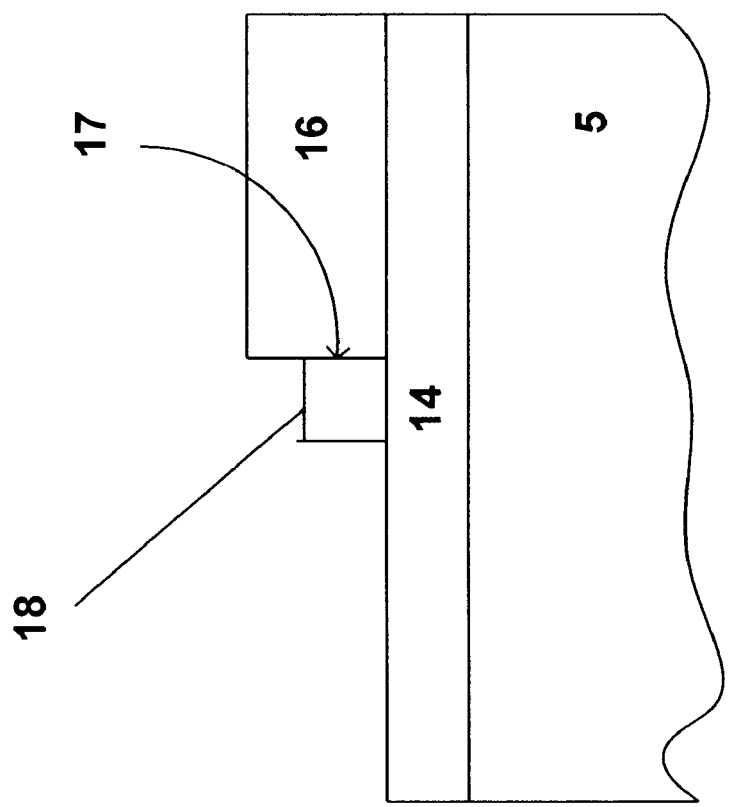
FIG. 4B illustrates a cross-sectional view of a portion of FIG. 4A according to one aspect of the present invention.

Referring to FIGS. 4A and 4B, a directional etch is performed to remove the horizontal portions of the sidewall films 18 (represented by the outer portion of the black line rectangle) covering the flat surfaces of the substrate 5, sidewall templates 16 (represented by the grey rectangle) and gate conductor film while not substantially removing the vertical portion of the sidewall films 18 adjacent the sidewalls 17 (represented by the inner portion of the black line rectangle) of the sidewall templates 16. A dry anisotropic etch process is employed whereby the horizontal portions of the sidewall films 18 are removed. Dry anisotropic etch techniques typically involve using a plasma containing one or more fluorine compounds such as $C_4F_8$. The etch technique does not significantly etch or degrade the sidewall templates 16 or the gate conductor film 14. In this connection, the sidewall templates 16 and the gate conductor film 14 act as etch stop layers when performing the directional etch of the sidewall films 18. Specifically referring to FIG. 4B, a cross sectional view of the dashed box section along the arrows in the lower left hand portion of FIG. 4A is shown highlighting the results of the directional etch of the horizontal portions of the sidewall films 18.

Figure 5:
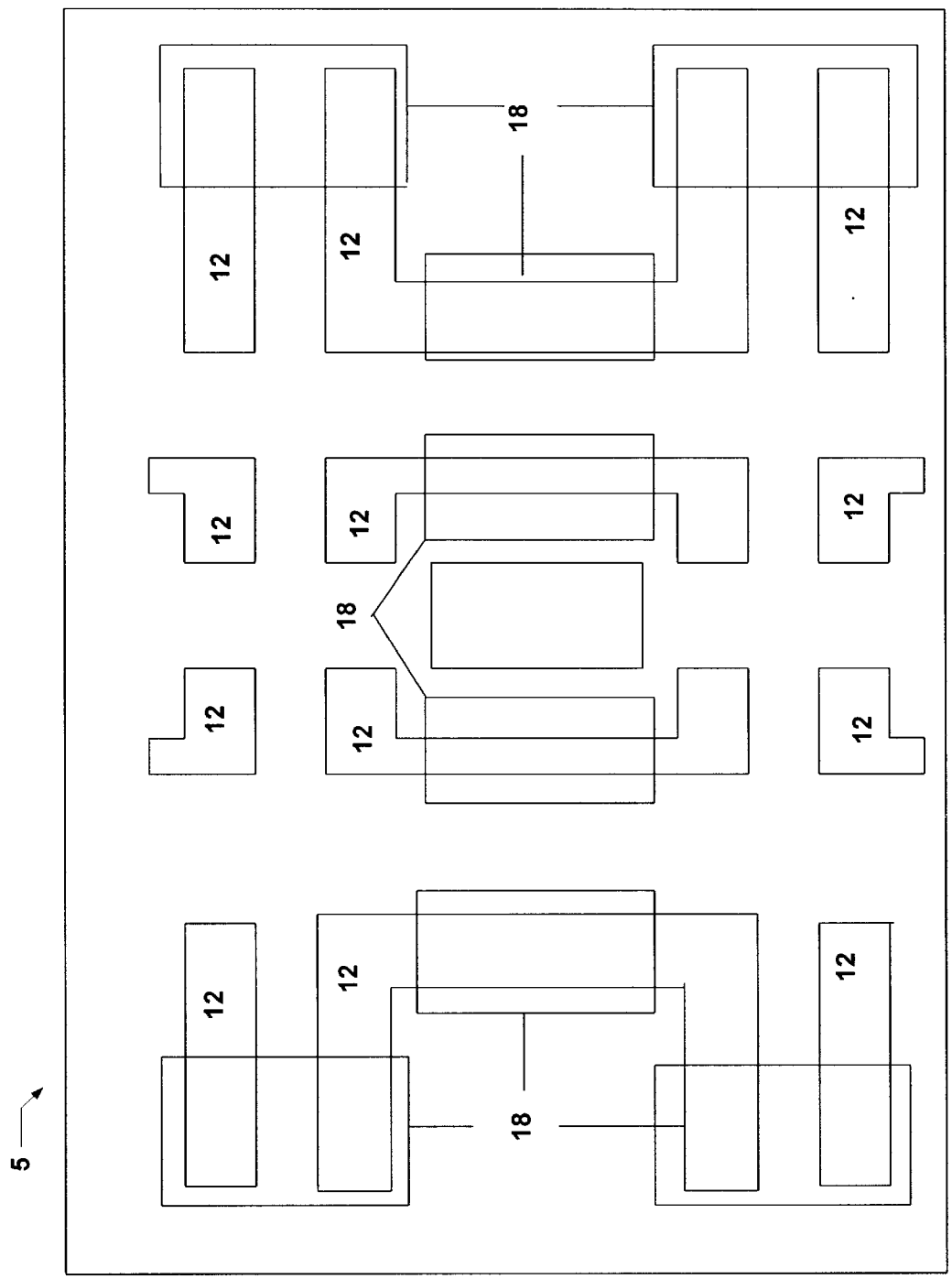
FIG. 5 illustrates a plan view of a sidewall patterned sidewall film according to one aspect of the present invention.

Referring to FIG. 5, the sidewall templates 16 are removed or stripped. A dry anisotropic etch process is employed to remove the sidewall templates 16. The dry etch technique involves using a plasma containing an oxygen containing compound, such as $O_2$. The etch technique is conducted so that the vertical portions of the sidewall films 18 and the gate conductor film are not significantly etched or degraded. In this connection, the gate conductor film and portions of the underlying substrate 5 act an as etch stop layer when etching the sidewall templates 16.

Figure 6:
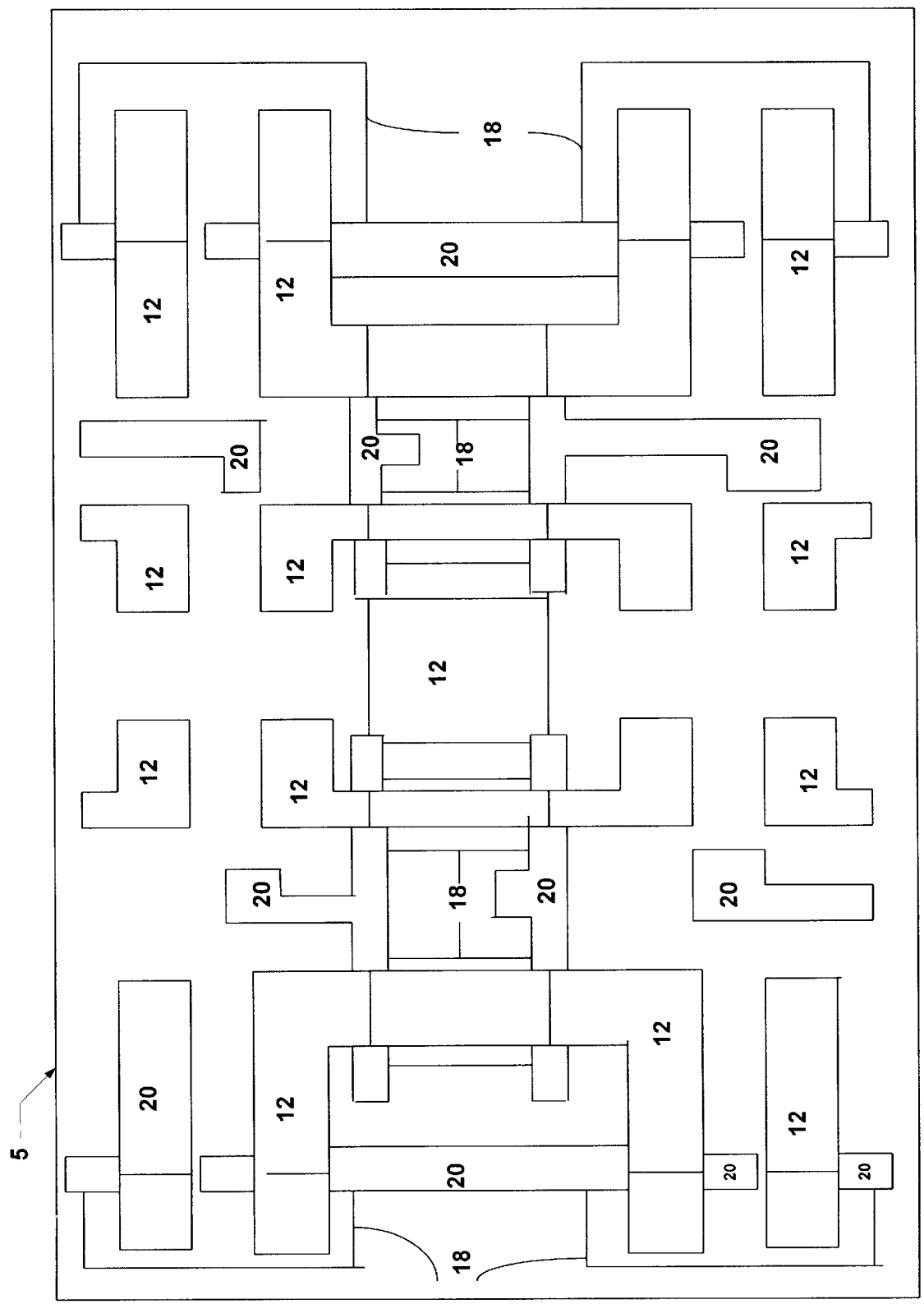
FIG. 6 illustrates a plan view of a substrate during processing according to one aspect of the present invention.

Referring to FIG. 6, a photoresist mask 20 is formed over the substrate 5, leaving exposed the portions of the gate conductor film that are subsequently etched, portions of sidewall films 18. The photoresist mask 20 also protects portions of the gate conductor film that subsequently forms the regularly sized gate conductor. Suitable photolithography techniques may be employed to form the photoresist mask 20 exposing a portion of the preliminary gate conductor.

The exposed portions of the gate conductor film are etched in a directional manner wherein the remaining vertical portion of the sidewall films 18 and the photoresist mask 20 act as a mask for the portion of the gate conductor film located directly underneath. In one embodiment, the exposed portions of the gate conductors are etched using an anisotropic etching process using a plasma containing fluorine or chlorine compounds, such as $Cl_2$. The etch technique is selected so that the vertical portion of the sidewall films 18 or the underlying substrate 5 is not significantly etched or degraded. Removing portions of the gate conductor film exposes active regions 12 and field oxide regions 10 on the substrate 5.

Figure 7:
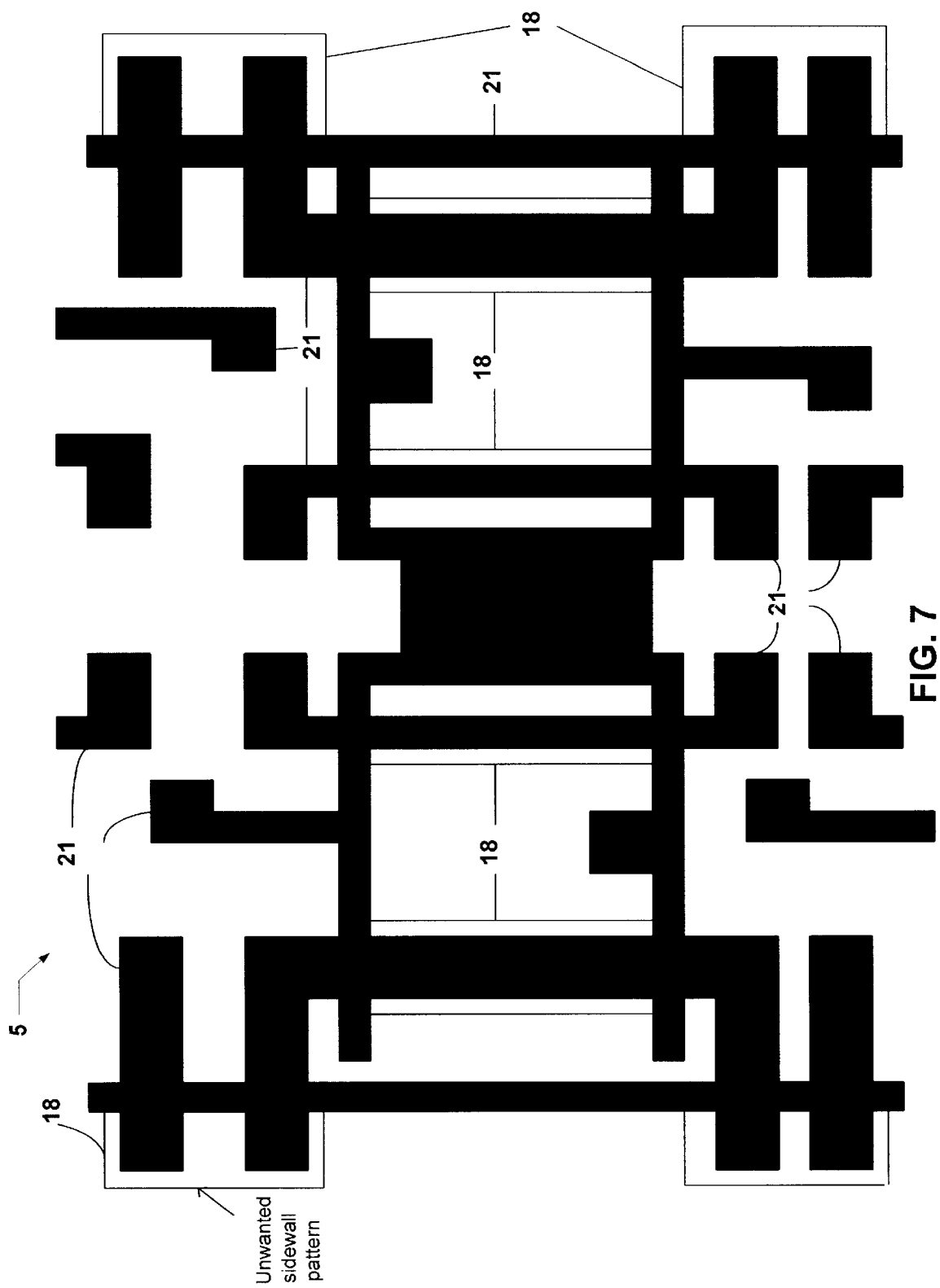
FIG. 7 illustrates a plan view of a sidewall trim mask according to one aspect of the present invention.

Referring to FIG. 7, the photoresist mask 20 is then removed or stripped using suitable techniques such as oxygen ashing. A trim mask 21, which protects the gate conductors (not shown), sub-lithographic gate conductors (not shown), and active regions (not shown), is deposited and patterned over substrate 5 using suitable lithographic techniques.

Figure 8:
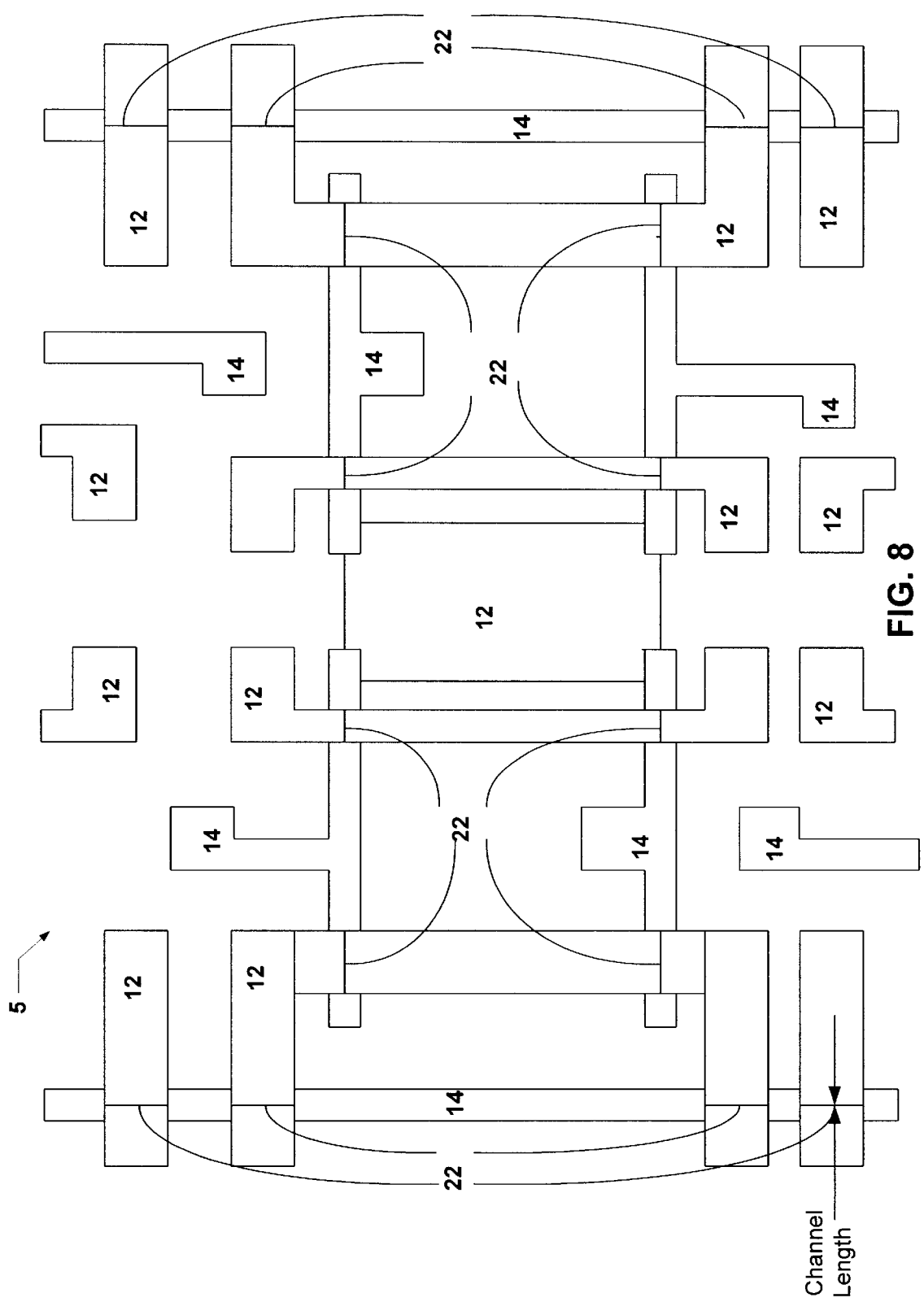
FIG. 8 illustrates a plan view of a sub-lithographic gate conductor in an SRAM cell layout according to one aspect of the methods according to the present invention.

Referring to FIG. 8, the remaining vertical portions of the sidewall films 18 are stripped or removed from the gate conductors 14 and other portions of the substrate 5 leaving sub-lithographic gate conductors 22. Despite the formation of a continuous pattern (of the vertical portions of the sidewall films 18) wherein the total angle of material is 360°, circuit patterns may be fabricated using the present invention.

The dimensions of the thinned portion of the resulting sub-lithographic gate conductors 22 are from about 100 Å to about 2,000 Å in width and from about 300 Å to about 3,000 Å in height, and in this embodiment, about 500 Å in width and about 1,000 Å in height. The width of the gate conductor 14 is larger than the width of the sub-lithographic gate conductors 22, and in this embodiment, is about 3,000 Å. The gate transistor channel length of the sub-lithographic gate conductors 22 is not determined or set based on the limits of the resolution of any photolithography techniques. Instead, the gate transistor channel length of the sub-lithographic gate conductors 22 is determined or set based on the thickness of the sidewall films 18.

Figure 9:
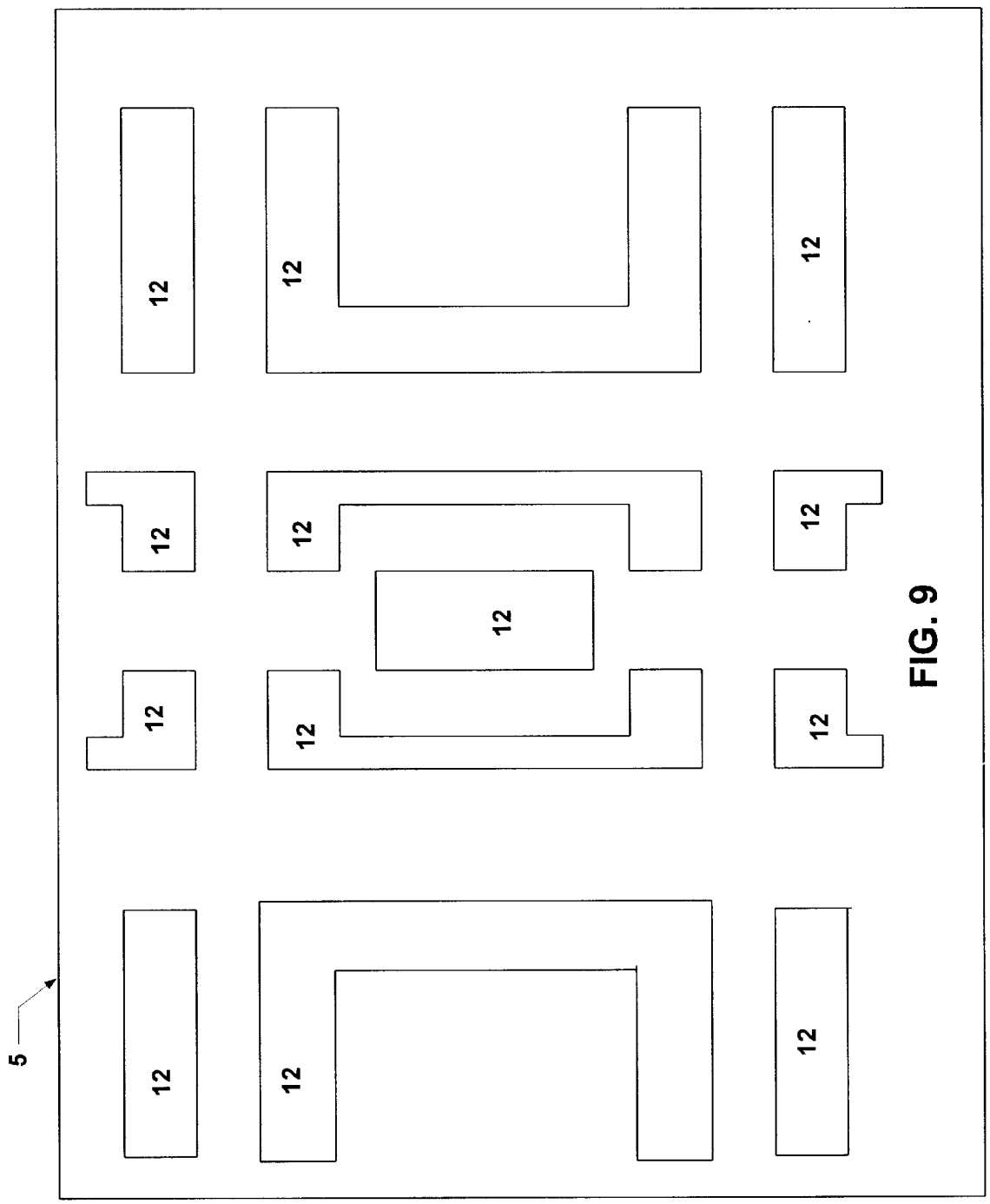
FIG. 9 illustrates a plan view of an initial substrate according to one aspect of the methods according to the present invention.

Referring to FIGS. 9–16, a another group of embodiments are described. Referring to FIG. 9, a substrate 5 is provided having a field oxide 10, active regions 12, and a gate conductor film (not shown) thereover or therein in a layout of an SRAM cell. The gate conductor film is not shown since it covers the entire substrate in this embodiment (although portions are shown later). The active regions 12 subsequently form source/drain regions. The gate conductor film contains polysilicon or amorphous silicon, but in this embodiment, the gate conductor film comprises polysilicon. Although the substrate may optionally or additionally have various elements, regions and/or layers thereover including metal layers, barrier layers, dielectric layers, device structures, active regions such as active silicon regions or areas, active elements and passive elements including additional polysilicon gates, wordlines, source regions, drain regions, bit lines, bases, emitters, collectors, conductive lines, conductive plugs, only a field oxide 10 and an active regions 12 are shown. The thickness of the gate conductor film is from about 300 Å to about 3,000 Å, and in this embodiment, about 1,500 Å.

Figure 10:
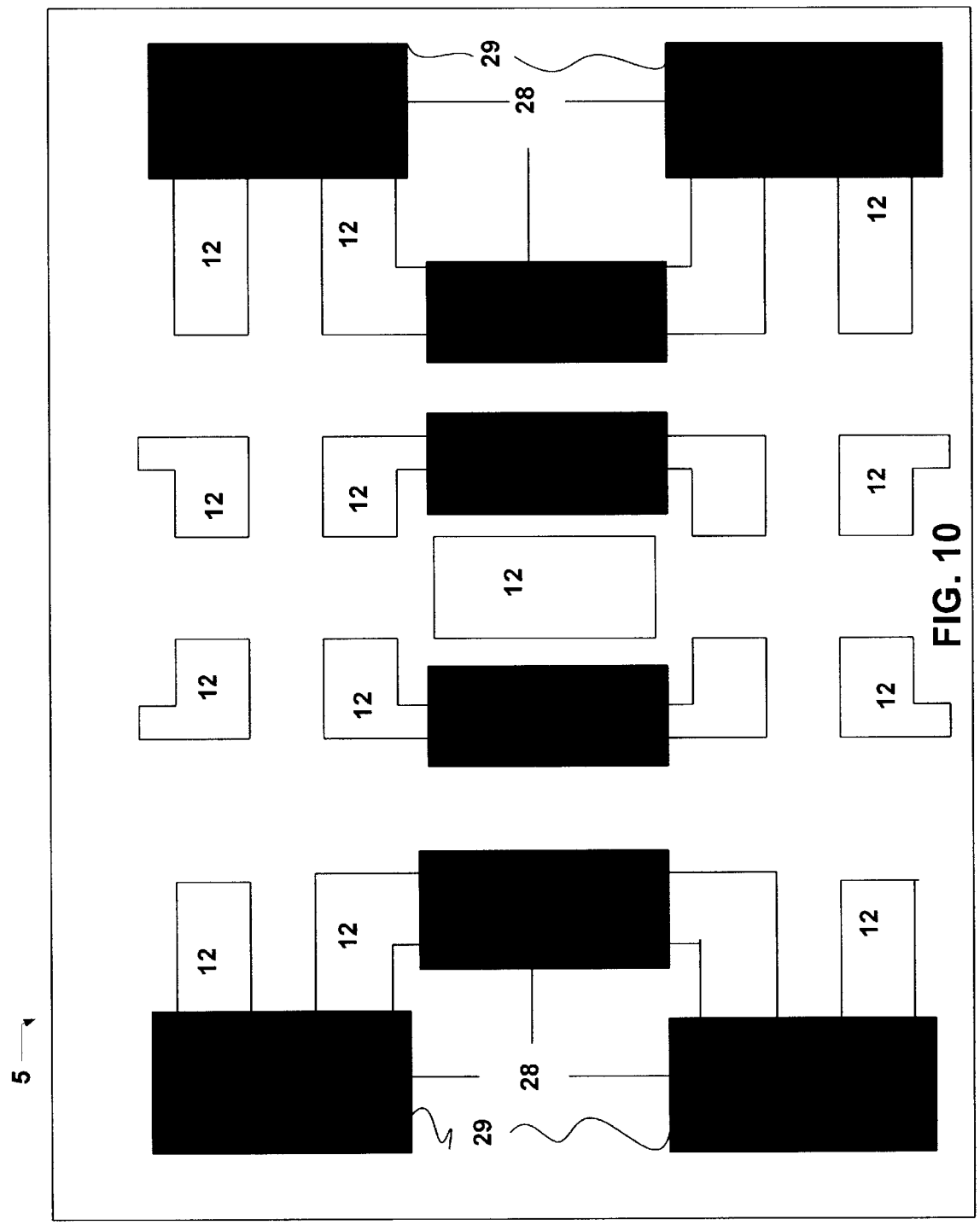
FIG. 10 illustrates a plan view of a mask for forming a sidewall template according to one aspect of the present invention.

Referring to FIG. 10, a plurality of sidewall template masks 28 are provided over a portion of the gate conductor film wherein portions of the gate conductor film are exposed and other portions covered. The sidewall template masks 28 are also located partially over the active regions 12. Specifically, the sidewall template mask is provided over the entire substrate 5 and etched back so that the sidewall template masks 28 have at least one sidewall 29 substantially perpendicular to the substrate surface and specifically the gate conductor film surface (for clarity, not all sidewalls 29 are indicated in FIG. 10). The sidewall template masks 28 are made of a photoresist such as an I-line photoresist material, and deposited by suitable spin-coating techniques, and etched back or patterned using suitable photolithographic techniques. The exposed portions of the gate conductor film are partially etched wherein at least one step is formed in the gate conductor film corresponding to the sidewalls 29. Dry etch techniques are used employing a plasma containing fluorine or chlorine compounds, such as $Cl_2$ and HBr.

The amount or thickness of the gate conductor film etched or removed varies, but typically from about 10% to about 75% of the thickness of the exposed portions of the gate conductor film is etched. In this embodiment, partial etching removes about 50% of the thickness of the exposed portions of the gate conductor film. Thus, the thickness of the exposed portions of the gate conductor film after etching is about 750 Å. After the gate conductor film is partially etched, the sidewall template masks 28 are stripped or removed from the substrate 5 using any suitable technique, such as oxygen ashing. In this embodiment, the gate conductor film is surface modified by having a sidewall (not shown) formed therein and thus acts as a sidewall template. The sidewalls are substantially perpendicular to the substrate surface.

Figure 11:
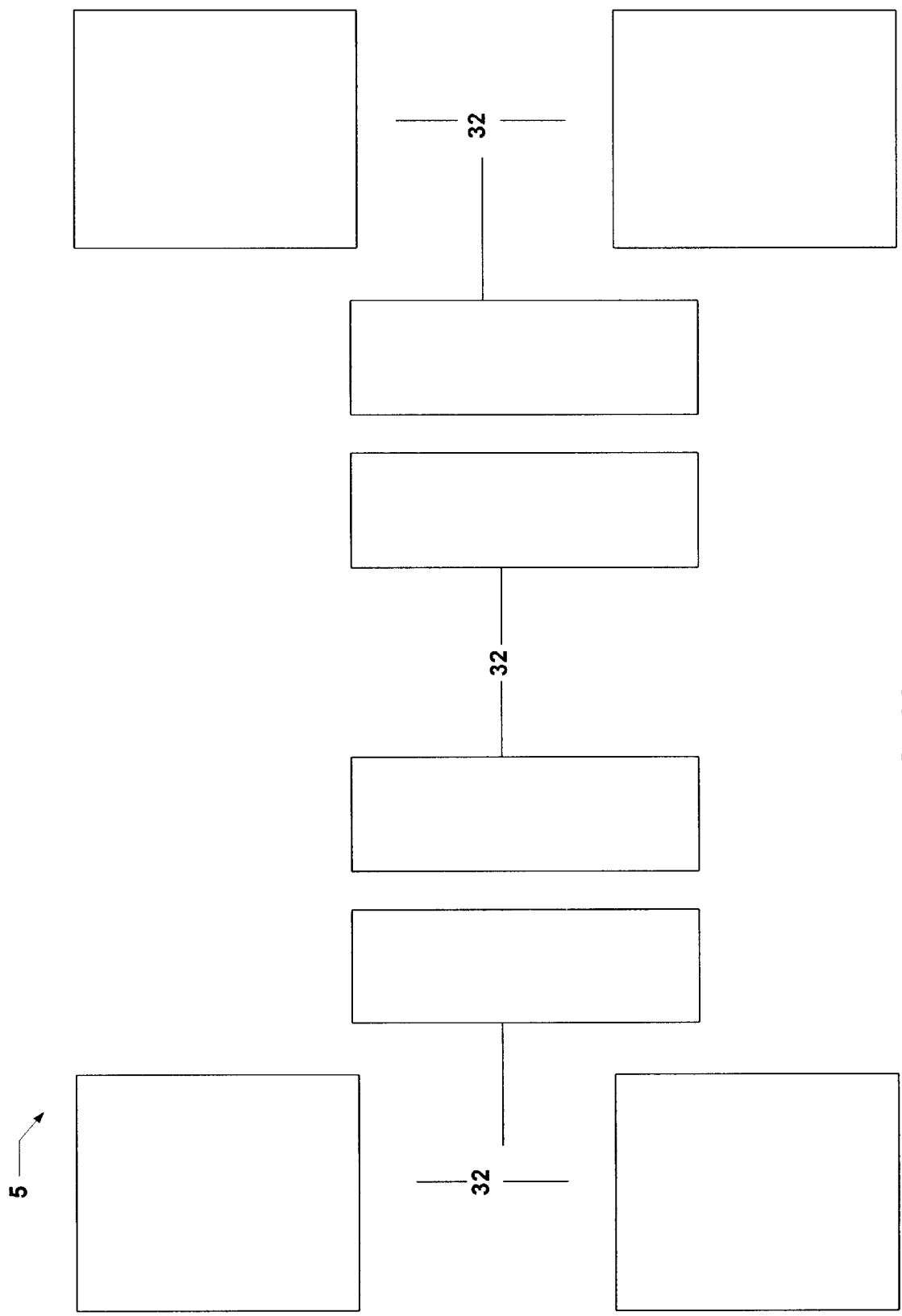
FIG. 11 illustrates a plan view of a sidewall film according to one aspect of the present invention.

Referring to FIG. 11, a sidewall film 34 is deposited over at least the portion of the gate conductor film, and typically over the entire substrate 5 as shown. The sidewall film 34 conforms to the profile of the gate conductor film which acts as sidewall template. That is, the sidewall film 34 is formed in a substantially uniform thickness over the gate conductor film wherein sidewalls 32 continue to be definable. The sidewall film 34 is selected so that there is etch selectivity between the gate conductor film and the sidewall film 34. In this embodiment, the sidewall film 34 contains a silicon containing film such as silicon nitride. The sidewall film is made by CVD techniques. The thickness of the sidewall film 34 is typically from about 100 Å to about 2,000 Å and in this embodiment, about 400 Å.

There are two main portions of the sidewall film 34. The first is a vertical portion of the sidewall film 34 adjacent the sidewalls 32 of the gate conductor film. The second is a horizontal portion of the sidewall film 34 that covers the flat surfaces (parallel or substantially parallel to the plane of the flat surface of the substrate 5) of the gate conductor film.

Figure 12A:
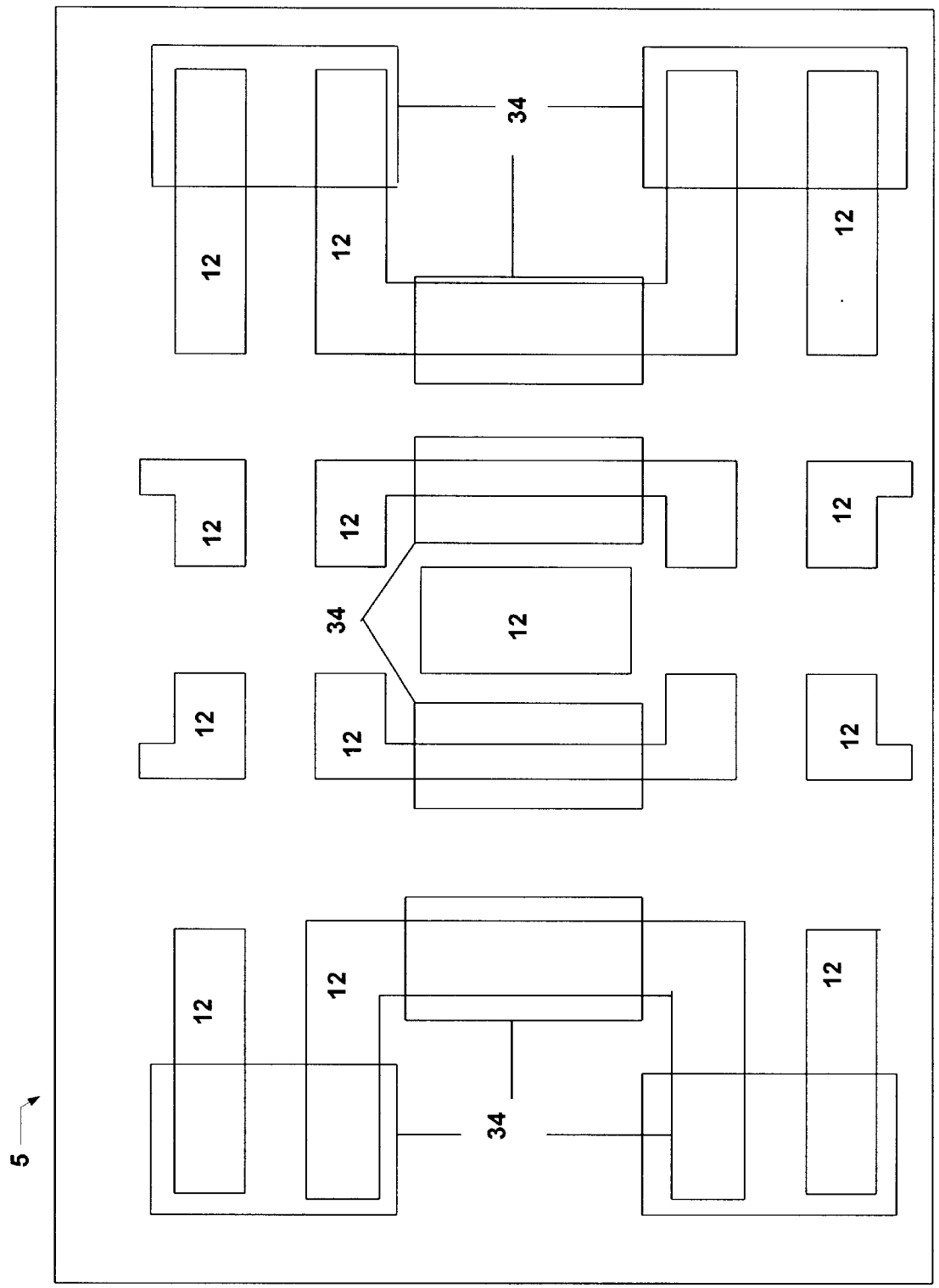
FIG. 12A illustrates a plan view of a sidewall patterned sidewall film according to one aspect of the present invention.

Referring to FIGS. 12A and 12B, a directional etch is performed to remove the horizontal portions of the sidewall film 34 covering the flat surfaces of the substrate 5, and specifically the gate conductor film 14 while not substantially removing the vertical portions of the sidewall film 34 adjacent the sidewalls 32 of the gate conductor film 14. A dry anisotropic etch process is employed whereby the horizontal portions of the sidewall film 34 are removed. Dry anisotropic etch techniques typically involve using a plasma containing one or more fluorine compounds such as $CHF_3$ optionally with $O_2$. The etch technique does not significantly etch or degrade the gate conductor film 14. In this connection, the gate conductor film 14 acts as etch stop layers when performing the directional etch of the sidewall film 34. Specifically referring to FIG. 12B, a cross sectional view of the dashed box section along the arrows in the upper left hand portion of FIG. 12A is shown highlighting the results of the directional etch of the horizontal portions of the sidewall film 34 and partial etching of the gate conductors 14.

Figure 13:
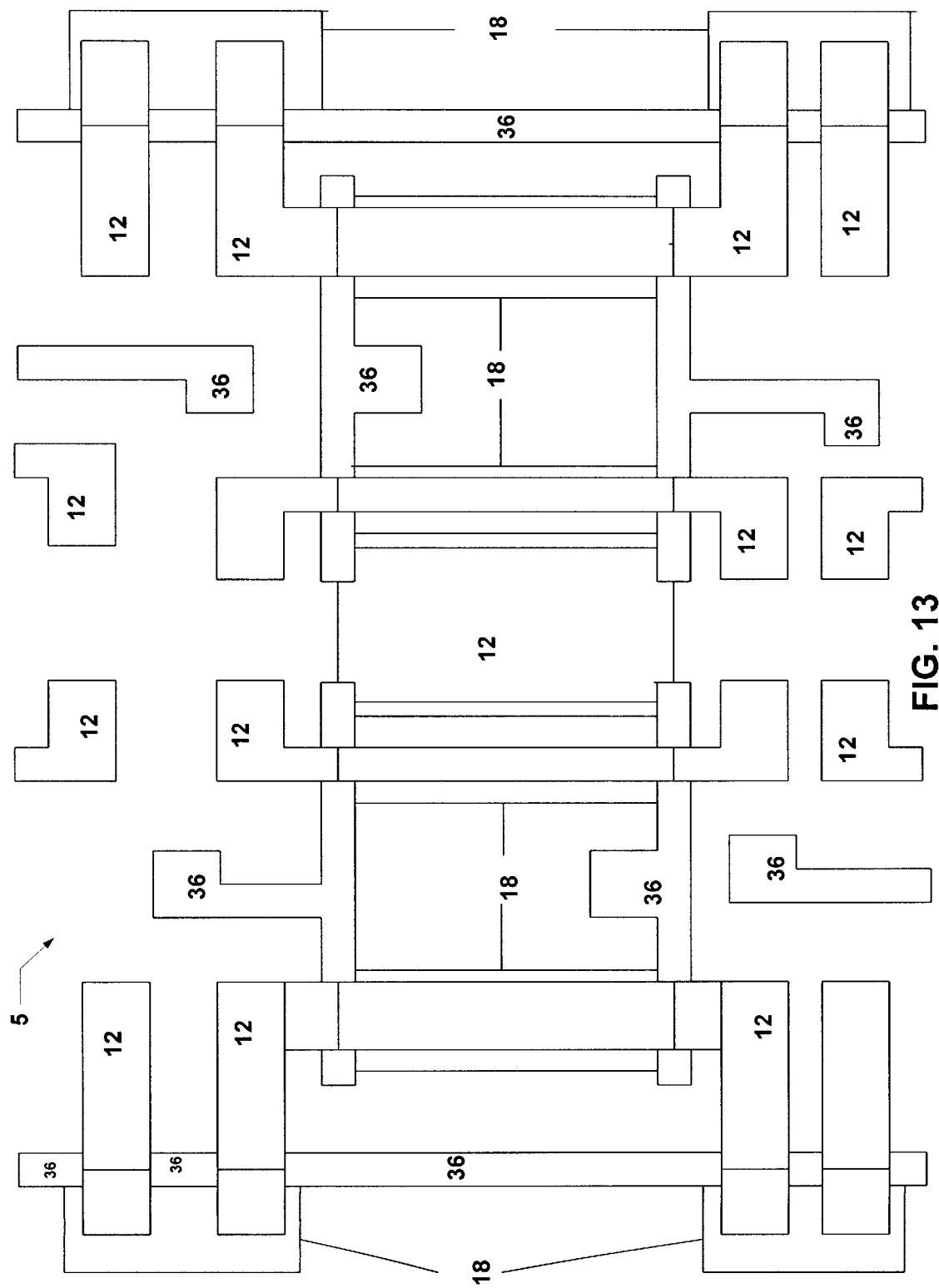
FIG. 13 illustrates a plan view of a substrate during processing according to one aspect of the present invention.

Referring to FIG. 13, a second photoresist mask 36 is formed over the substrate 5, leaving exposed the portion of the gate conductor film that is subsequently etched. The photoresist mask 36 also protects the gate conductor film underneath the photoresist mask 36 and the sidewall film 34. Suitable photolithography techniques may be employed to form the photoresist mask 36 exposing a portion of the gate conductor film.

The exposed portions of the gate conductor film are etched in a directional manner wherein the remaining vertical portion of the sidewall films 34 act as a mask for the portion of the gate conductor film located directly underneath. In one embodiment, the exposed portions of the gate conductor film are etched using an anisotropic etching process using a plasma containing fluorine or chlorine compounds, such as $Cl_2$ and HBr. The etch technique is selected so that the vertical portion of the sidewall films 34 or the underlying substrate 5 is not significantly etched or degraded. Removing portions of the gate conductor film exposes active regions 12 and field oxide regions 10 on the substrate 5.

Figure 14:
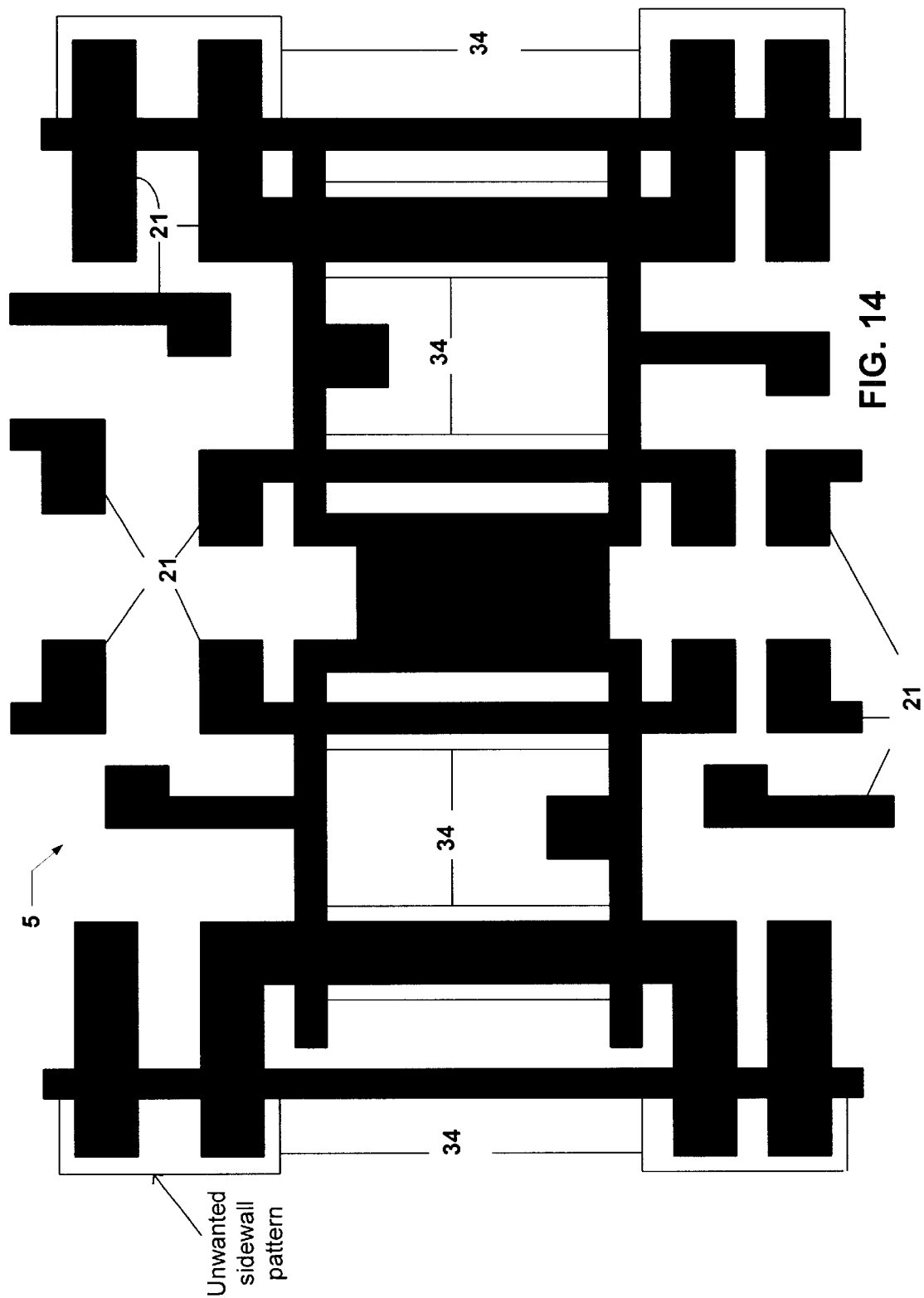
FIG. 14 illustrates a plan view of a trim mask according to one aspect of the present invention.

Referring to FIG. 14, the second photoresist mask 36 is then removed or stripped using suitable techniques such as oxygen ashing. A trim mask 21, which protects the gate conductors (not shown), sub-lithographic gate conductors (not shown), and active regions (not shown), is deposited and patterned over substrate 5 using suitable lithographic techniques.

Figure 15:
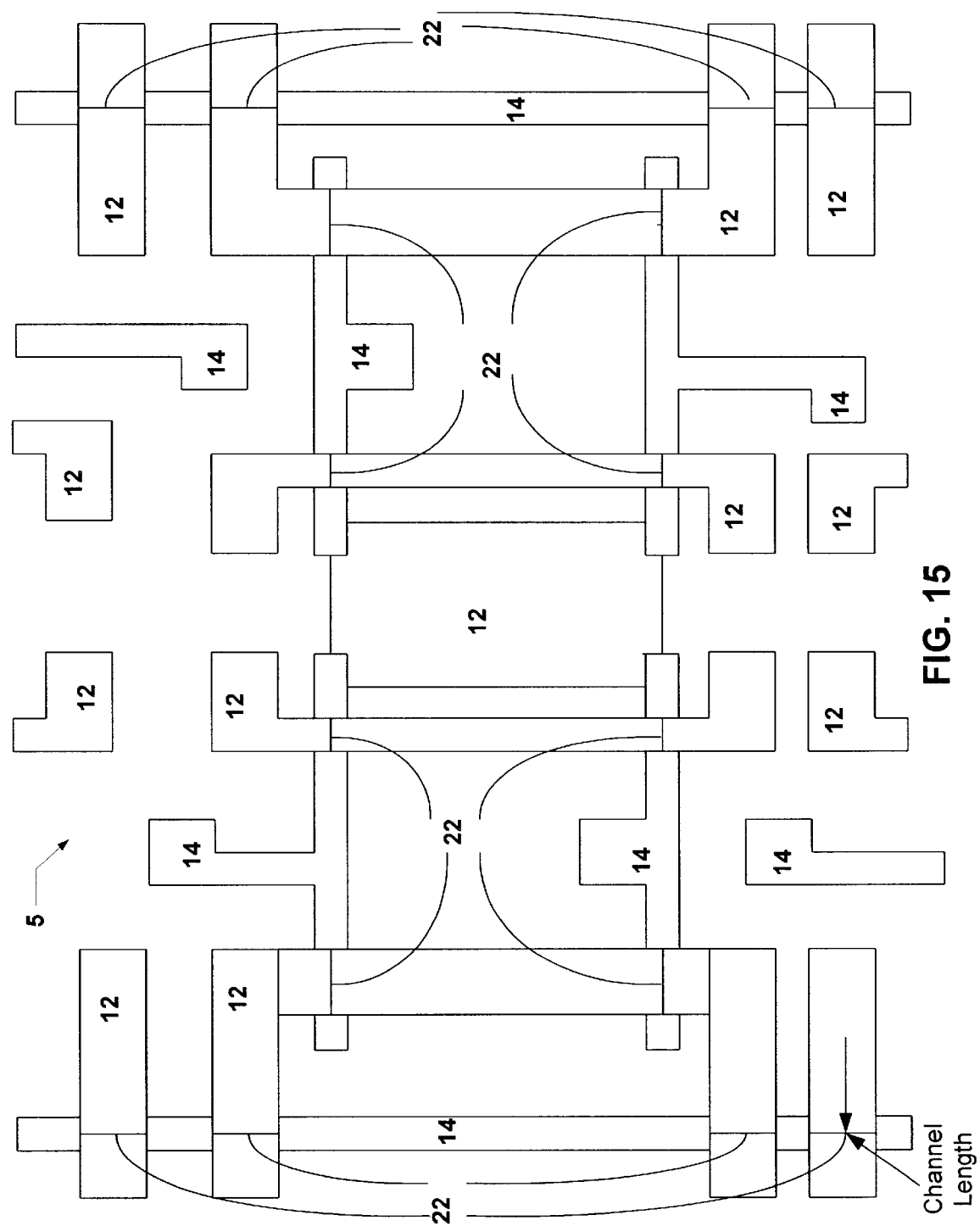
FIG. 15 illustrates a plan view of a sub-lithographic gate conductor in an SRAM cell layout according to one aspect of the present invention.

Referring to FIG. 15, the remaining vertical portion of the sidewall film 34 is stripped or removed from the gate conductors 14 and other portions of the substrate 5 leaving a sub-lithographic gate conductor 22. The dimensions of the thinned portion of the resulting sub-lithographic gate conductor 22 are from about 100 Å to about 2,000 Å in width and from about 300 Å to about 3,000 Å in height, and in this embodiment, about 400 Å in width and about 750 Å in height. The width of the gate conductors 14 is greater than the width of the sub-lithographic gate conductor 22, and in this embodiment, is about 4,000 Å. The gate transistor channel length of the sub-lithographic gate conductor 22 is not determined or set based on the limits of the resolution of any photolithography techniques. Instead, the gate transistor channel length of the sub-lithographic gate conductor 22 is determined or set based on the thickness of the sidewall films 34.

Although the invention has been shown and described with respect to a certain preferred embodiment or embodiments, it is obvious that equivalent alterations and modifications will occur to others skilled in the art upon the reading and understanding of this specification and the annexed drawings. In particular regard to the various functions performed by the above described components (assemblies, devices, circuits, etc.), the terms (including any reference to a "means") used to describe such components are intended to correspond, unless otherwise indicated, to any component which performs the specified function of the described component (i.e., that is functionally equivalent), even though not structurally equivalent to the disclosed structure which performs the function in the herein illustrated exemplary embodiments of the invention. In addition, while a particular feature of the invention may have been disclosed with respect to only one of several embodiments, such feature may be combined with one or more other features of the other embodiments as may be desired and advantageous for any given or particular application.

What is claimed is:

1. A method of forming a circuit structure for a memory cell containing at least one sub-lithographic gate conductor comprising:

providing a substrate comprising active regions and a preliminary gate conductor film over portions of the substrate and portions of the active regions;

forming a sidewall template mask having at least one sidewall over a portion of the preliminary gate conductor film that is positioned over portions of the active regions, wherein the sidewall template mask comprises at least one of silicon oxynitride, a nitrogen rich film, a photoresist material, a low K polymer material;

forming a sidewall film over the sidewall template mask, the sidewall film having a vertical portion adjacent the sidewall of the sidewall template mask and a horizontal portion in areas not adjacent the sidewall of the sidewall template mask, wherein the sidewall film comprises at least one of silicon oxynitride, silicon oxide, and an acid catalyzed photoresist;

removing the horizontal portion of the sidewall film exposing a portion of the sidewall template mask and removing the sidewall template mask;

providing a second mask over the portions of the preliminary gate conductor film that are not positioned over portions of the active regions thereby exposing other portions of the preliminary gate conductor film;

removing exposed other portions of the preliminary gate conductor film thereby forming the circuit structure containing the sub-lithographic gate conductor and gate conductors;

providing a trim mask over the active regions, portions of the sub-lithographic gate conductor and the gate conductors leaving exposed the vertical portion of the sidewall film; and removing exposed portions of the sidewall film and portions of the preliminary gate conductor film under the sidewall film.

2. The method of claim 1 further comprising removing the vertical portion of the sidewall film over portions of the sub-lithographic gate conductor that are positioned over portions of the active regions.

3. The method of claim 1, wherein the sidewall of the sidewall template mask is substantially perpendicular to at least one of a substrate surface and a surface of the preliminary gate conductor film.

4. The method of claim 1, wherein the sidewall film has a thickness from about 100 Å to about 2,000 Å.

5. The method of claim 1, wherein the sub-lithographic gate conductor comprises polysilicon or amorphous silicon.

6. The method of claim 1, wherein the sub-lithographic gate conductor has a width of about 150 nm or less.

7. A method of forming a circuit structure for a memory cell containing at least one sub-lithographic gate conductor comprising:

providing a substrate comprising active regions and a preliminary gate conductor film over portions of the substrate and portions of the active regions, the preliminary gate conductor film comprising one of polysilicon and amorphous silicon;

forming a sidewall template mask having at least one sidewall over a portion of the preliminary gate conductor film that is positioned over portions of the active regions, wherein the sidewall template mask comprises at least one of a nitrogen rich film, a photoresist material, a low K polymer material;

forming a sidewall film over the sidewall template mask, the sidewall film having a vertical portion adjacent the sidewall of the sidewall template mask and a horizontal portion in areas not adjacent the sidewall of the sidewall template mask;

removing the horizontal portion of the sidewall film exposing a portion of the sidewall template mask and removing the sidewall template mask;

providing a second mask over portions of the preliminary gate conductor film that are not positioned over portions of the active regions thereby exposing other portions of the preliminary gate conductor film;

removing exposed other portions of the preliminary gate conductor film thereby forming the circuit structure containing the sub-lithographic gate conductor having a width of about 200 nm or less and gate conductors;

providing a trim mask over the active regions, portions of the sub-lithographic gate conductor and the gate conductors leaving exposed the vertical portion of the sidewall film; and removing exposed portions of the sidewall film and portions of the preliminary gate conductor film under the sidewall film.

8. The method of claim 7 further comprising removing the vertical portion of the sidewall film over portions of the active regions.

9. The method of claim 7, wherein the sidewall template mask comprises at least one of a nitrogen rich film and a photoresist material.

10. The method of claim 9, wherein the nitrogen rich film comprises one of silicon nitride, nitride rich silicon oxynitride, titanium nitride, tantalum nitride, and tungsten nitride.

11. The method of claim 7, wherein the horizontal portion of the sidewall film is removed using a dry anisotropic etch process.

12. The method of claim 7, wherein the exposed portions of the sidewall template are removed using a dry anisotropic etch process.

13. The method of claim 7, wherein the sidewall film comprises at least one of silicon oxide, silicon nitride and silicon oxynitride.

14. The method of claim 7, wherein the sidewall film has a thickness from about 200 Å to about 1,500 Å.

15. The method of claim 7, wherein the sub-lithographic gate conductor has a height from about 300 Å to about 3,000 Å and a width from about 200 Å to about 1,500 Å.

16. A method of forming a circuit structure for a memory cell containing at least one sub-lithographic gate conductor comprising:

providing a substrate comprising active regions and a preliminary gate conductor film over portions of the substrate and portions of the active regions, the preliminary gate conductor film comprising one of polysilicon and amorphous silicon;

etching a portion of the preliminary gate conductor film that is positioned over portions of the active regions forming a sidewall in the preliminary gate conductor film over portions of the active regions;

forming a sidewall film over the preliminary gate conductor film, the sidewall film having a vertical portion adjacent the sidewall of the preliminary gate conductor film and a horizontal portion in areas not adjacent the sidewall of the preliminary gate conductor film;

removing the horizontal portion of the sidewall film exposing portions of the preliminary gate conductor film;

providing a mask over portions of the preliminary gate conductor film that are not over portions of the active regions thereby exposing other portions of the preliminary gate conductor film;

removing exposed other portions of the preliminary gate conductor film forming the circuit structure containing the sub-lithographic gate conductor having a width of about 200 nm or less and gate conductors;

providing a trim mask over the active regions, portions of the sub-lithographic gate conductor and the gate conductors leaving exposed the vertical portion of the sidewall film; and removing exposed portions of the sidewall film and portions of the preliminary gate conductor film under the sidewall film.

17. The method of claim 16, wherein the sidewall of the preliminary gate conductor film is formed using a photoresist to cover a second portion of the preliminary gate conductor film and using a mixture of $Cl_2$ and HBr to etch a first portion of the preliminary gate conductor film.

18. The method of claim 16, wherein the sidewall film comprises at least one of silicon oxide, silicon nitride and silicon oxynitride.

19. The method of claim 16, wherein the sub-lithographic gate conductor has a height from about 500 Å to about 2,500 Å and a width from about 200 Å to about 1000 Å.

20. A method of forming a memory cell comprising a sub-lithographic gate conductor comprising:

providing a substrate comprising active regions and a preliminary gate conductor film over portions of the substrate and portions of the active regions, the preliminary gate conductor film comprising polysilicon;

forming a sidewall template mask over a portion of the preliminary gate conductor film, the sidewall template mask having at least one sidewall on a portion of the preliminary gate conductor film that is positioned over portions of the active regions, wherein the sidewall template mask comprises at least one of a photoresist material and a low K polymer material;

forming a sidewall film over the sidewall template mask, the sidewall film having a vertical portion adjacent the sidewall of the sidewall template mask and a horizontal portion in areas not adjacent the sidewall of the sidewall template mask;

removing the horizontal portion of the sidewall film exposing a portion of the sidewall template mask using anisotropic etching;

removing the exposed portions of the sidewall template mask exposing portions of the preliminary gate conductor film using anisotropic etching;

providing a second mask over the substrate and portions of the preliminary gate conductor film that are not over portions of the active regions thereby exposing other portions of the preliminary gate conductor film;

removing exposed other portions of the preliminary gate conductor film thereby forming a memory cell comprising the sub-lithographic gate conductor having a transistor channel length of about 200 nm or less and gate conductors having a width larger than the transistor channel length of the sub-lithographic gate conductor;

providing a trim mask over the active regions, portions of the sub-lithographic gate conductor and the gate conductors leaving exposed the vertical portion of the sidewall film; and removing the vertical portion of the sidewall film and portions of the preliminary gate conductor film under the sidewall film.

21. The method of claim 20, further comprising removing the vertical portion of the sidewall film using a second trim mask.

22. The method of claim 20, wherein the memory cell is a static random access memory cell.

23. The method of claim 20, wherein the sidewall template comprises a low K polymer material.

24. The method of claim 20, wherein the sidewall film comprises at least one of silicon oxide, silicon nitride and silicon oxynitride.

* * * * *